(12) United States Patent
Kanegae

(10) Patent No.: US 8,994,125 B2
(45) Date of Patent: Mar. 31, 2015

(54) SEMICONDUCTOR DEVICE INCLUDING A FIELD EFFECT TRANSISTOR

(75) Inventor: Kenshi Kanegae, Niigata (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 0 days.

(21) Appl. No.: 13/589,762

(22) Filed: Aug. 20, 2012

(65) Prior Publication Data

US 2012/0313188 A1     Dec. 13, 2012

Related U.S. Application Data

(63) Continuation of application No. PCT/JP2010/005438, filed on Sep. 3, 2010.

(30) Foreign Application Priority Data

Feb. 24, 2010    (JP) .................................. 2010-038843

(51) Int. Cl.
| | |
|---|---|
| H01L 29/78 | (2006.01) |
| H01L 21/8238 | (2006.01) |
| H01L 21/8234 | (2006.01) |
| H01L 29/66 | (2006.01) |
| H01L 27/11 | (2006.01) |

(52) U.S. Cl.
CPC ... *H01L 21/823864* (2013.01); *H01L 21/823425* (2013.01); *H01L 27/1104* (2013.01); *H01L 29/6656* (2013.01); *H01L 29/7833* (2013.01); *H01L 29/7843* (2013.01)
USPC ........... 257/412; 257/287; 257/288; 257/334; 257/357; 257/758; 438/585; 438/623; 438/624; 438/626; 438/622

(58) Field of Classification Search
CPC ............... H01L 21/823425; H01L 29/7843; H01L 29/7833; H01L 21/823864; H01L 29/6656; H01L 27/11
USPC ......... 257/287, 288, 334, 357, 758, 760, 776; 438/622, 623, 624, 625, 626
See application file for complete search history.

(56) References Cited

U.S. PATENT DOCUMENTS

| | | | | |
|---|---|---|---|---|
| 4,716,131 A | * | 12/1987 | Okazawa et al. | 438/586 |
| 5,625,217 A | * | 4/1997 | Chau et al. | 257/412 |
| 5,966,597 A | * | 10/1999 | Wright | 438/197 |
| 6,017,809 A | * | 1/2000 | Inumiya et al. | 438/585 |
| 6,096,640 A | * | 8/2000 | Hu | 438/652 |

(Continued)

FOREIGN PATENT DOCUMENTS

| | | |
|---|---|---|
| JP | 60-115265 A | 6/1985 |
| JP | 2-304979 A | 12/1990 |

(Continued)

OTHER PUBLICATIONS

International Search Report issued in PCT/JP2010/005438 issued on Oct. 5, 2010.

*Primary Examiner* — Jarrett Stark
*Assistant Examiner* — Mohammad M Hoque
(74) *Attorney, Agent, or Firm* — McDermott Will & Emery LLP

(57) ABSTRACT

A semiconductor device includes, on a semiconductor substrate, a gate insulating film, a pMIS metal material or an nMIS metal material, a gate electrode material, and a gate sidewall metal layer.

24 Claims, 24 Drawing Sheets

(56) References Cited

U.S. PATENT DOCUMENTS

| | | |
|---|---|---|
| 6,187,657 B1 * | 2/2001 | Xiang et al. .................. 438/596 |
| 6,630,721 B1 * | 10/2003 | Ligon .......................... 257/413 |
| 6,781,207 B2 * | 8/2004 | Kumeno ....................... 257/377 |
| 2003/0107090 A1 | 6/2003 | Kumeno |
| 2004/0056285 A1 * | 3/2004 | Cabral et al. ................. 257/288 |
| 2004/0137689 A1 * | 7/2004 | Dokumaci et al. ........... 438/305 |
| 2005/0153530 A1 * | 7/2005 | Ku et al. ...................... 438/587 |
| 2006/0115940 A1 | 6/2006 | Kim et al. |
| 2008/0017930 A1 | 1/2008 | Kim et al. |
| 2008/0121999 A1 * | 5/2008 | Kawahara et al. ............ 257/366 |
| 2008/0258244 A1 * | 10/2008 | Goto et al. .................... 257/412 |
| 2008/0283928 A1 * | 11/2008 | Sato et al. ..................... 257/369 |
| 2009/0230479 A1 * | 9/2009 | Hsu et al. ..................... 257/369 |
| 2010/0109012 A1 * | 5/2010 | Griebenow et al. ............. 257/66 |
| 2010/0187579 A1 * | 7/2010 | Arnold et al. ................. 257/288 |

FOREIGN PATENT DOCUMENTS

| | | | |
|---|---|---|---|
| JP | 02-304979 A | | 12/1990 |
| JP | 05-243564 A | | 9/1993 |
| JP | 5-243564 A | | 9/1993 |
| JP | 8-037239 A | * | 2/1996 |
| JP | 08-037239 A | | 2/1996 |
| JP | 8-508851 A | | 9/1996 |
| JP | 8-340104 A | | 12/1996 |
| JP | 2003-179056 A | | 6/2003 |
| JP | 2006-157015 A | | 6/2006 |
| JP | 2008-016538 A | | 1/2008 |
| JP | 2008-288465 A | | 11/2008 |
| JP | 2010-021363 A | | 1/2010 |
| JP | 2010-021363 A | | 1/2010 |

* cited by examiner

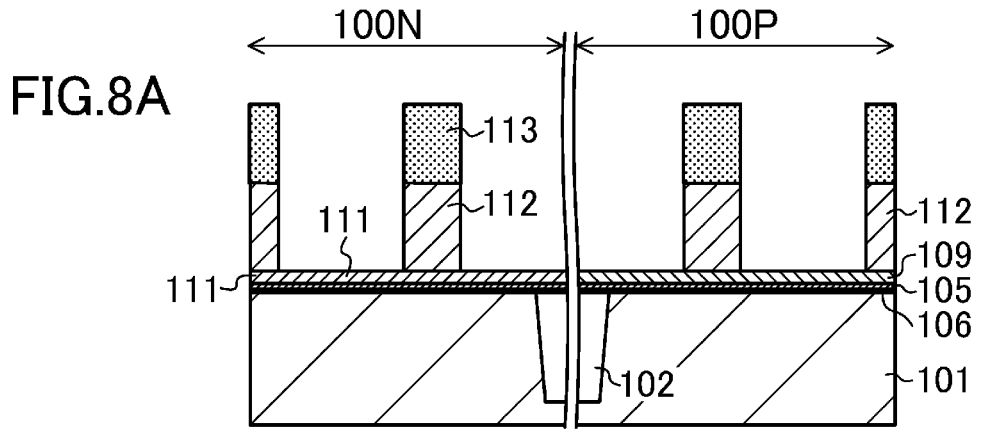
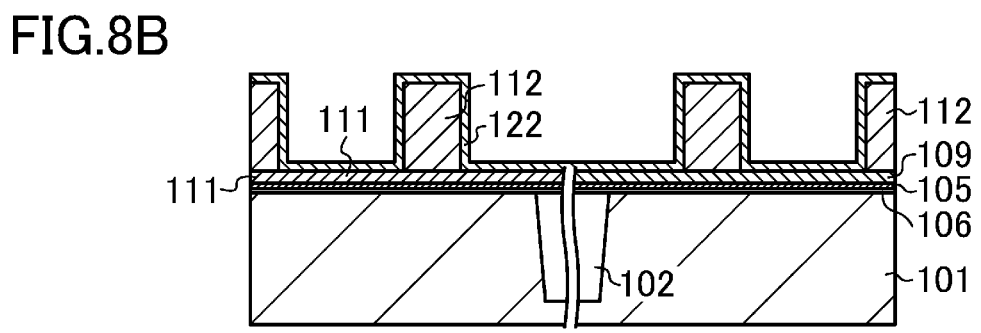
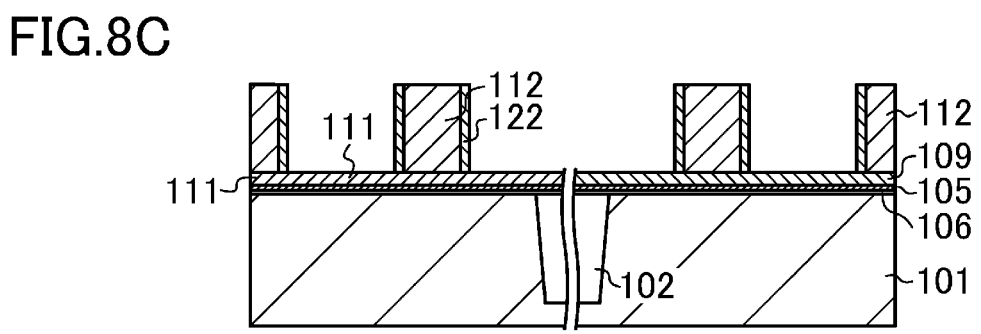
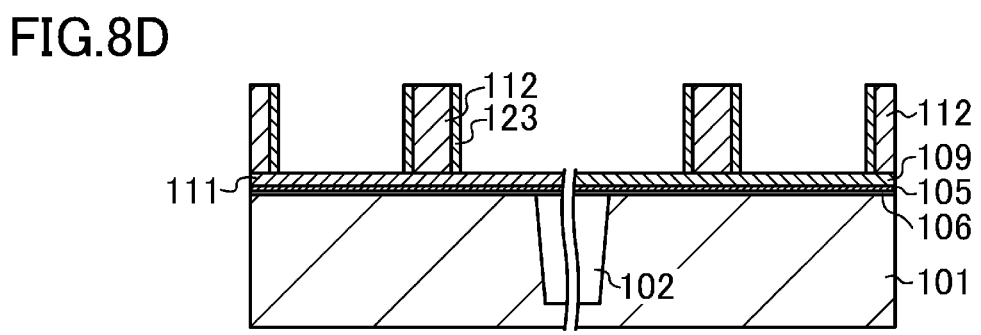

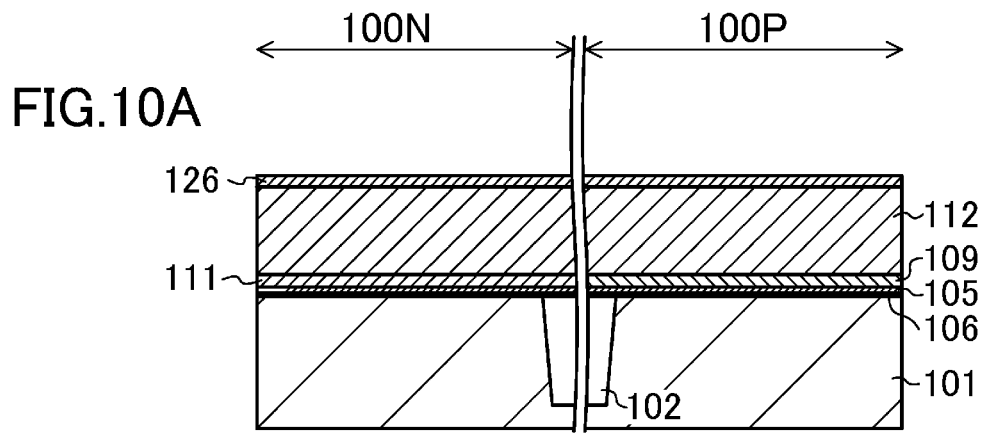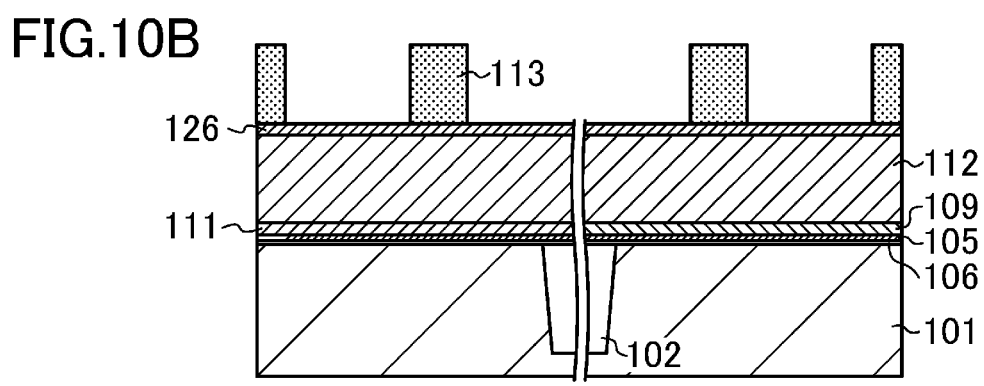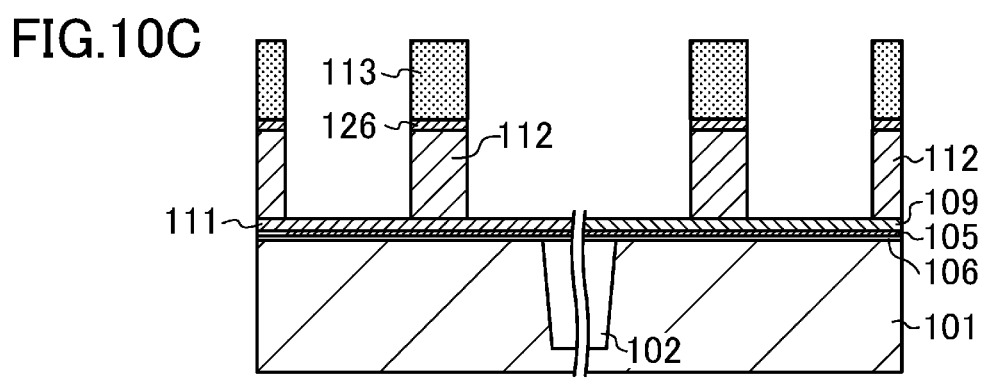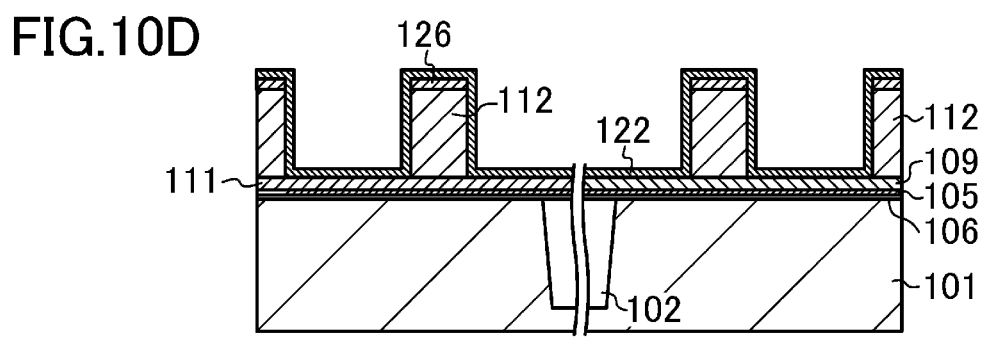

SEMICONDUCTOR DEVICE INCLUDING A FIELD EFFECT TRANSISTOR

CROSS-REFERENCE TO RELATED APPLICATIONS

This is a continuation of PCT International Application PCT/JP2010/005438 filed on Sep. 3, 2010, which claims priority to Japanese Patent Application No. 2010-038843 filed on Feb. 24, 2010. The disclosures of these applications including the specifications, the drawings, and the claims are hereby incorporated by reference in their entirety.

BACKGROUND

The subject matter disclosed herein relates to semiconductor devices and methods for fabricating the semiconductor devices. More particularly, the subject matter disclosed herein relates to semiconductor devices including a field effect transistor and methods for fabricating the semiconductor devices.

Advances in integration and miniaturization of semiconductor devices in recent years have been accompanied by rapid advances in miniaturization of transistors. To reduce the size of a transistor, the thickness of the gate insulating film has been decreased. At present, the equivalent oxide thickness (EOT) is as low as about 2.0 nm or less. If such a thin gate insulating film is a conventional $SiO_2$ gate insulating film, the leakage current increases to a non-negligible level. Therefore, a film having a high dielectric constant (hereinafter referred to as a "high-k film") is employed as the gate insulating film. If the high-k film is employed as the gate insulating film, the actual physical thickness can be increased to reduce a tunnel current, and the EOT can be decreased to reduce power consumption.

On the other hand, the further miniaturization of transistors has raised a problem that the capacitance of the gate electrode decreases due to depletion in the electrode. If the gate electrode is a conventional polysilicon gate electrode, the decrease in the capacitance corresponds to an increase of about 0.5 nm in the thickness of the silicon oxide film, and therefore, is not negligible compared with the thickness of the gate electrode. Therefore, the gate electrode may be comprised of a metal instead of conventional polysilicon. If the metal gate electrode is employed, the above depletion problem can be reduced.

Incidentally, if the gate electrode is formed of a polysilicon film as in the conventional art, a separate p-channel and n-channel regions (i.e., two separate regions having different work functions) can be easily formed by photolithography and ion implantation. For example, when a complementary metal oxide semiconductor field effect transistor (CMOS-FET) is formed in which the gate electrode is formed of a polysilicon film, then if the gate electrode of the nMOSFET is comprised of n$^+$ PolySi and the gate electrode of the pMOSFET is comprised of p$^+$ PolySi, a low threshold is obtained. This technique (dual work function) is widely used.

However, typically, different work functions are imparted to the metal gate electrodes using a technique corresponding to that which is used when the polysilicon gate electrodes are formed, i.e., implantation of impurities of different types into the respective regions after deposition of a single film. Therefore, it is difficult to easily change the work function. In this circumstance, for example, a technique has been studied in which the metal gate electrodes in the n-channel and p-channel regions are comprised of a single or different metal materials, and fluorine or carbon is implanted into the metal material or materials of the metal gate electrodes (see, for example, Japanese Patent Publication No. 2006-157015).

There are roughly two processes for forming the metal gate electrode. Specifically, in one of the two processes, a metal electrode layer is previously formed in steps in which a gate resist pattern is formed by photolithography and a gate electrode is processed (gate-first process). In the other process, a metal electrode layer is newly formed in a step after a gate resist pattern is formed by photolithography and a gate electrode is processed (gate-last process). The gate-first process can be performed using a process flow which is almost the same as the technique of forming the polysilicon gate electrode, which has been employed before the technique of forming the metal gate electrode. Therefore, high-temperature annealing etc. required for formation of interfaces between the semiconductor substrate, gate insulating film, metal layer, and silicon layer which are located at the gate electrode, can be applied.

On the other hand, the gate-last process requires a lot of additional steps, such as the step of removing a silicon layer and a metal layer, etc., in a gate electrode which has been once formed, the step of burying a metal layer, and the step of removing and polishing the metal layer, etc., and therefore, the process cost is high. It is also necessary to form an interface located at the gate electrode after extension implantation and source/drain implantation required for formation of the transistor are performed. Therefore, a high-temperature thermal treatment etc. would cause a degradation in the performance of the transistor, and therefore, a sufficient thermal treatment cannot be performed. Therefore, it is difficult to carry out the process, and it is necessary to address variations in the transistor.

Therefore, the gate-first process, which is a promising low-cost process for future CMOS device formation, has been extensively studied. In the gate-first process, a CMOS device is typically formed as follows.

FIGS. 23A-23D, 24A-24D, and 25A and 25B are cross-sectional views showing successive steps in a method for fabricating a conventional semiconductor device. Note that, in each figure, a region on the left-hand side of the drawing sheet is a region 100N in which an n-channel MIS transistor is formed, and a region on the right-hand side of the drawing sheet is a region 100P in which a p-channel MIS transistor is formed.

Initially, as shown in FIG. 23A, an isolation structure 102 is formed in a semiconductor substrate 101, and thereafter, a p-well and an n-well are formed in the regions 100N and 100P, respectively, of the semiconductor substrate 101. Next, a high-k film (e.g., a $HfO_2$ film etc.) is formed as a gate insulating film 105 on an entire surface of the semiconductor substrate 101. Next, a metal film (e.g., TiN etc.) for a metal gate electrode is deposited as a gate electrode material 107 on the gate insulating film 105.

Next, as shown in FIG. 23B, a resist pattern 108 having an opening only in the region 100P is formed, and thereafter, carbon ions are implanted into the gate electrode material 107 using the resist pattern 108 as a mask, to form a pMIS metal material 109. Next, the resist pattern 108 is removed.

Next, as shown in FIG. 23C, a resist pattern 110 having an opening only in the region 100N is formed, and thereafter, fluorine ions are implanted into the gate electrode material 107 using the resist pattern 110 as a mask, to form an nMIS metal material 111. Next, the resist pattern 110 is removed.

Next, as shown in FIG. 23D, a polysilicon film is deposited as a gate electrode material 112 on an entire surface of the semiconductor substrate 101.

Next, as shown in FIG. 24A, a gate resist pattern 113 is formed.

Next, as shown in FIG. 24B, the gate electrode material 112 is processed into a gate electrode shape using the gate resist pattern 113 as a mask.

Next, as shown in FIG. 24C, the gate resist pattern 113 is removed. Next, the pMIS metal material 109 and the nMIS metal material 111 are removed by anisotropic etching until the gate insulating film 105 is exposed. Next, after the removal of the pMIS metal material 109 and the nMIS metal material 111, the exposed gate insulating film 105, and an interface layer 106 located therebelow, are removed by wet etching etc.

Next, as shown in FIG. 24D, an insulating film (e.g., a TEOS film or a SiN film, etc.) is deposited on an entire surface of the semiconductor substrate 101, and thereafter, an etch-back process is performed by anisotropic dry etching, to form offset sidewalls 114. Next, an extension implantation layer 115 is formed by ion implantation in surfaces of the semiconductor substrate 101 in the regions 100N and 100P separately.

Next, as shown in FIG. 25A, an oxide film (e.g., a TEOS film or an NSG film, etc.) is deposited as a lower sidewall film 116 on an entire surface of the semiconductor substrate 101, and thereafter, a SiN film is deposited as an upper sidewall film 117. Next, an etch-back process is performed by anisotropic dry etching on the multilayer film of the lower and upper sidewall films 116 and 117 to form sidewalls 118 including the offset sidewall 114, the lower sidewall film 116, and the upper sidewall film 117.

Moreover, a source/drain implantation layer 119 is formed by implanting arsenic (As) and phosphorus (P) ions into the region 100N and boron (B) ions into the region 100P. Next, the impurities introduced by the ion implantation are activated by an activation thermal treatment.

Next, as shown in FIG. 25B, Ni, which is a high melting point metal, etc. is deposited by sputtering etc. on an entire surface of the semiconductor substrate 101, and a thermal treatment for silicidation is then performed. Thereafter, an unreacted region after the silicidation is removed by wet etching. As a result, a silicide layer 121 is formed in each of a surface of the source/drain implantation layer 119 in the surface of the semiconductor substrate 101 and a surface of the gate electrode material 112.

SUMMARY

However, in the multilayer structure of the metal gate electrode in the conventional semiconductor device, an interface is formed at a boundary between the silicide layer 121 and the gate electrode material 112, and in addition, an interface layer is newly formed at a boundary between the gate electrode material 112 and the pMIS metal material 109 and a boundary between the gate electrode material 112 and the nMIS metal material 111 (these boundaries are peculiar to the metal gate electrode). If oxygen is present on metal surfaces of the pMIS metal material 109 and the nMIS metal material 111, a natural oxide film is formed on the metal surfaces, and therefore, the interface resistance is likely to increase. In particular, if a metal which does not have a bond with nitrogen or carbon etc. other than oxygen is present on the surface, a natural oxide film is particularly significantly likely to be formed, and the metal surface is particularly easily oxidized because there are a large number of dangling bonds on the metal surface.

At present, in order to achieve high-speed device operation, the performance of transistors needs to be improved, and the resistance and capacitance involved with a signal delay of transistors need to be reduced. Therefore, the further device miniaturization has led to a reduction in the area of the gate electrode, resulting in a non-negligible effective interface resistance. The increase in the interface resistance causes a delay in the high-speed operation of the device, resulting in a degradation in performance or an increase in the power consumption of the device, which causes a failure.

Moreover, the interface resistance between the silicon (the gate electrode material 112) and metal included in the gate electrode increases with a decrease in the conductivity of the silicon. It is essential to introduce an appropriate dopant in order to ensure a sufficient conductivity of the silicon. Therefore, there is a technique of introducing a dopant by source/drain implantation. In recent years, the depth of source/drain implantation has become shallower in order to improve the transistor performance, and therefore, a sufficient amount of dopant may not reach the interface. To address this problem, the same dopant may be previously introduced into the gate electrode material 112 in the regions 100N and 100P, but in this case, a PN junction is formed in the gate electrode, and therefore, the problem is not overcome. Therefore, different dopants need to be introduced into the gate electrode material 112 in the regions 100N and 100P, and therefore, an additional step or steps are likely to increase the cost.

The present disclosure describes implementations of a semiconductor device in which, in a metal gate electrode including a boundary between a metal and silicon etc. or a boundary between silicide and silicon etc., which is parallel to the substrate surface, the connection resistance of a transistor is reduced, and therefore, a degradation in characteristics, such as a transistor delay during high-speed operation or variations in transistor characteristics, etc., is not likely to occur, and a low-cost structure is provided, and a method for fabricating the semiconductor device.

An example semiconductor device according to an aspect of the present disclosure and a method for fabricating the semiconductor device will be described hereinafter.

An example semiconductor device including a transistor formed on a semiconductor substrate, includes a gate insulating film formed on the semiconductor substrate, a first conductive film formed on and in contact with the gate insulating film, a middle layer formed on and in contact with the first conductive film and containing a silicon material, and a second conductive film formed on and in contact with the first conductive film and in contact with a sidewall of the middle layer.

The example semiconductor device may further include a third conductive film formed on and in contact with the middle layer. The second conductive film may also be formed in contact with a sidewall of the third conductive film.

In the example semiconductor device, the third conductive film may be comprised of a silicide material or a metal material.

In this case, when the third conductive film is comprised of the silicide material, the third conductive film may contain at least one selected from the group consisting of Ni, Co, Ti, W, Pt, and Mo.

In the example semiconductor device, the middle layer may be comprised of a material containing silicon as a major component. The material may be polysilicon, amorphous silicon, or porous silicon.

In this case, the material containing silicon as a major component may be an undoped silicon film or a silicon film doped with an atom other than silicon. The doped silicon film may be a film comprised of a material doped with at least one selected from phosphorus (P), arsenic (As), boron (B), indium (In), carbon (C), fluorine (F), nitrogen (N), oxygen (O), germanium (Ge), platinum (Pt), nickel (Ni), cobalt (Co), titanium (Ti), iron (Fe), tungsten (W), and molybdenum (Mo).

In this case, the middle layer may contain a P-type carrier and an N-type carrier in the material containing silicon as a major component so that the middle layer has a PN junction in a plane perpendicular to a main surface of the semiconductor substrate.

In this case, the middle layer may contain a P-type carrier and an N-type carrier in the material containing silicon as a major component so that the middle layer has a PN junction in a plane parallel to a main surface of the semiconductor substrate.

In the example semiconductor device, the middle layer may be comprised of an insulating film material which is silicon oxide, silicon nitride, silicon oxynitride, yttrium oxide, aluminum oxide, or aluminum nitride.

In the example semiconductor device, the middle layer may be formed of a multilayer film including a material containing silicon as a major component and an insulating film material. The material containing silicon as a major component may be polysilicon, amorphous silicon, or porous silicon. The insulating film material may include silicon oxide, silicon nitride, silicon oxynitride, yttrium oxide, aluminum oxide, and aluminum nitride.

In the example semiconductor device, the middle layer may be a film configured to apply or release stress to a channel surface of a gate electrode included in the transistor, and may be formed of a film of silicon nitride, porous silicon, silicide, SiGe, or SiC.

In the example semiconductor device, the middle layer may be a film configured to transmit light, and may be formed of a film of silicon oxide, silicon nitride, silicon oxynitride, iridium oxide, or ruthenium oxide.

In the example semiconductor device, the first conductive film may be a film configured to set a threshold of a gate electrode included in the transistor. The film may be a metal film comprised of at least one metal selected from the group consisting of Ti, Zr, Hf, V, Nb, Ta, Cr, Mo, and W, or a film comprised of a nitride, silicide, or carbide of at least one metal selected from the metal group, where the nitride of Ti, Ta, Zr, Hf, or Nb does not have a stoichiometric composition and contains a smaller amount of N.

In the example semiconductor device, the first conductive film may be a film configured to set a threshold of a gate electrode included in the transistor. The film may be a metal film comprised of at least one metal selected from the group consisting of Ni, Pd, Pt, Co, Rh, Ru, Cu, Ag, and Au, a film comprised of a nitride, silicide, carbide, or oxide of at least one metal selected from the metal group, a film comprised of a nitride of Ti, Ta, Zr, Hf, or Nb having a stoichiometric composition of TiN, TaN, ZrN, HfN, or NbN, a film comprised of Ru oxide, or a film comprised of Ir oxide.

In the example semiconductor device, the first conductive film may have a disconnection in a gate electrode included in the transistor in a plane perpendicular to a main surface of the semiconductor substrate.

In the example semiconductor device, the second conductive film may be formed of a metal film.

In this case, the second conductive film may be a metal film comprised of at least one metal selected from the group consisting of Ti, Zr, Hf, V, Nb, Ta, Cr, Mo, and W, or a film comprised of a nitride, silicide, or carbide of at least one metal selected from the metal group, where the nitride of Ti, Ta, Zr, Hf, or Nb does not have a stoichiometric composition and contains a smaller amount of N.

In this case, the second conductive film may be a film configured to set a threshold of a gate electrode included in the transistor. The film may be a metal film comprised of at least one metal selected from the group consisting of Ni, Pd, Pt, Co, Rh, Ru, Cu, Ag, and Au, a film comprised of a nitride, silicide, carbide, or oxide of at least one metal selected from the metal group, a film comprised of a nitride of Ti, Ta, Zr, Hf, or Nb having a stoichiometric composition of TiN, TaN, ZrN, HfN, or NbN, a film comprised of Ru oxide, or a film comprised of Ir oxide.

In this case, the second conductive film may be comprised of the same material for the first conductive film.

In this case, the second conductive film may be formed of a multilayer film including an inner conductive film and an outer conductive film. The inner conductive film may be a low-resistance film comprised of Ti, Zr, Hf, V, Nb, Ta, Cr, Mo, W, Ni, Pd, Pt, Co, Rh, Ru, Cu, Ag, or Au. The outer conductive film may be an oxidation resistant film comprised of TiN, TaN, Ir oxide, Ru oxide, Pt, or Au.

In the example semiconductor device, the second conductive film may be formed of a silicide film.

In this case, the second conductive film may contain at least one selected from the group consisting of Ni, Co, Ti, W, Pt, and Mo.

In this case, the second conductive film may be formed of a multilayer film including an inner conductive film and an outer conductive film. The inner conductive film may be a low-resistance film containing at least one selected from the group consisting of Ni, Co, Ti, W, Pt, and Mo. The outer conductive film may be an oxidation resistant film comprised of TiN, TaN, Ir oxide, Ru oxide, Pt, or Au.

In the example semiconductor device, when the second conductive film is formed of a silicide film and the third conductive film is formed of the silicide material, the second conductive film may be comprised of the same material for the third conductive film.

According to the aspect of the present disclosure, a semiconductor device is obtained in which, in a metal gate electrode including a boundary between a metal and silicon etc. or a boundary between silicide and silicon etc., which is parallel to the substrate surface, the connection resistance of a transistor is reduced, and therefore, a degradation in characteristics, such as a transistor delay during high-speed operation or variations in transistor characteristics, etc., is not likely to occur, and a low-cost structure is provided.

BRIEF DESCRIPTION OF THE DRAWINGS

FIGS. 8A-8D are cross-sectional views showing successive steps in a method for fabricating a semiconductor device according to a second embodiment of the present disclosure.

FIGS. 10A-10D are cross-sectional views showing successive steps in a method for fabricating a semiconductor device according to a variation (2) of the second embodiment of the present disclosure.

DETAILED DESCRIPTION

Figure 1A:
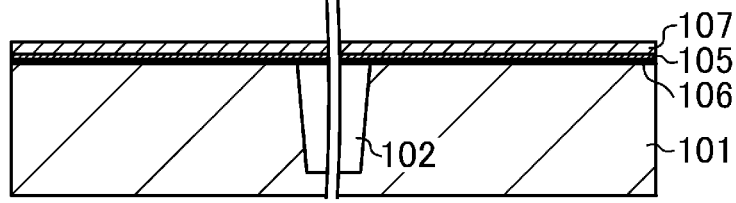
FIGS. 1A-1D are cross-sectional views showing successive steps in a method for fabricating a semiconductor device according to a first embodiment of the present disclosure.

Embodiments of the present disclosure will be described hereinafter with reference to the accompanying drawings. Note that the technical aspects of the present disclosure will be described in detail with reference to the drawings. Various modifications and additions can be made to the embodiments disclosed herein without departing the spirit and scope of the present disclosure by those skilled in the art after understanding the present disclosure.

(First Embodiment)

A semiconductor device according to a first embodiment of the present disclosure and a method for fabricating the semiconductor device will be described hereinafter with reference to the drawings.

FIGS. 1A-1D, 2A-2D, and 3A-3D are cross-sectional views showing successive steps in the method for fabricating the semiconductor device of the first embodiment of the present disclosure. Note that, in each figure, a region on the left-hand side of the drawing sheet is a region 100N in which an n-channel MIS transistor is formed, and a region on the right-hand side of the drawing sheet is a region 100P in which a p-channel MIS transistor is formed.

Initially, as shown in FIG. 1A, an isolation structure (shallow trench isolation (STI)) 102 is formed in a semiconductor substrate 101. Next, a p-well and an n-well are formed in the regions 100N and 100P, respectively, of the semiconductor substrate 101 by ion implantation for well formation, and thereafter, implantation for determining the thresholds of transistors is performed. Next, a gate insulating film 105 is formed whose thickness and quality are adjusted to each transistor, such as a logic transistor, an SRAM transistor, and an input/output (I/O) transistor, etc. Here, as an example, the gate insulating film 105 for a logic transistor will be described. The gate insulating film 105 formed of a hafnium silicon oxide ($HfSi_xO_y$) film (so-called high-k film), which has a sufficiently higher dielectric constant than that of a silicon oxide film, is formed on a surface of the semiconductor substrate 101. Note that the $HfSi_xO_y$ film has an EOT (the thickness of a silicon oxide film equivalent to the high-k film) of about 2.0 nm. At an interface between the semiconductor substrate 101 and the gate insulating film 105, a silicon oxide film which is as thin as about 1 nm is formed as an interface layer 106 by oxidizing the semiconductor substrate 101. Next, a metal film comprised of, for example, TiN having a thickness of about 5-20 nm is deposited as a gate electrode material 107 directly on the gate insulating film 105, in order to control the thresholds of the transistors.

Figure 1B:
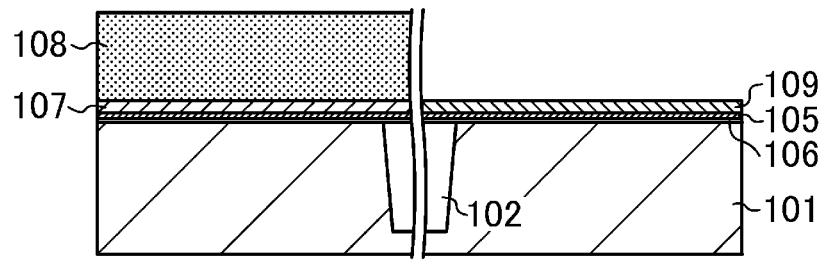

Next, as shown in FIG. 1B, a resist pattern 108 having an opening only in the region 100P is formed on the gate electrode material 107, and thereafter, carbon ions are implanted into the gate electrode material 107 using the resist pattern 108 as a mask, to form a pMIS metal material (first conductive film) 109. Next, the resist pattern 108 is removed.

Figure 1C:
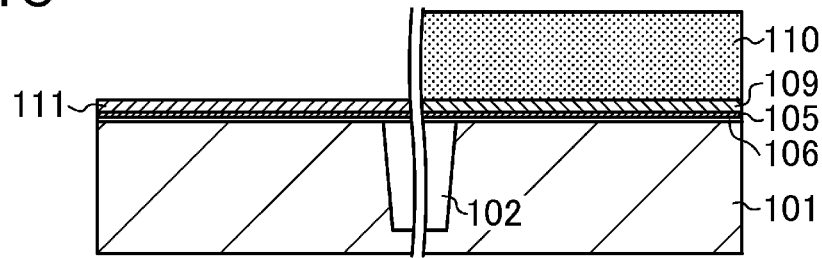

Next, as shown in FIG. 1C, a resist pattern 110 having an opening only in the region 100N is formed on an entire surface of the semiconductor substrate 101, and thereafter, fluorine ions are implanted into the gate electrode material 107 using the resist pattern 110 as a mask, to form an nMIS metal material (first conductive film) 111. Next, the resist pattern 110 is removed.

Figure 1D:
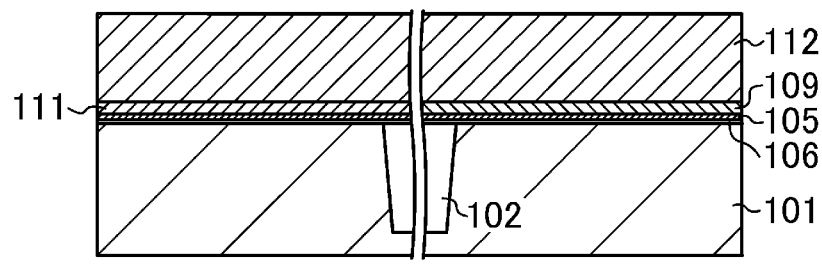

Next, as shown in FIG. 1D, for example, an undoped polysilicon film is deposited as a gate electrode material 112 on an entire surface of the semiconductor substrate 101.

Figure 2A:
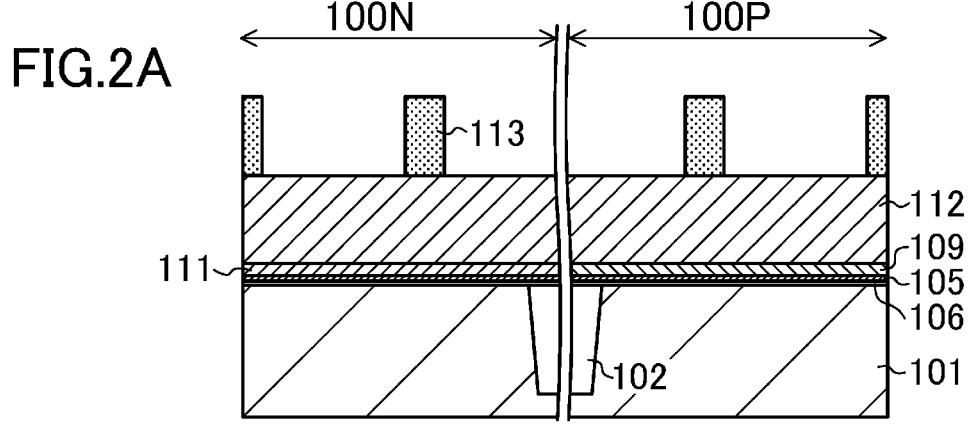
FIGS. 2A-2D are cross-sectional views showing successive steps in the method for fabricating the semiconductor device of the first embodiment of the present disclosure.

Next, as shown in FIG. 2A, a gate resist pattern 113 is formed on the gate electrode material 112.

Figure 2B:
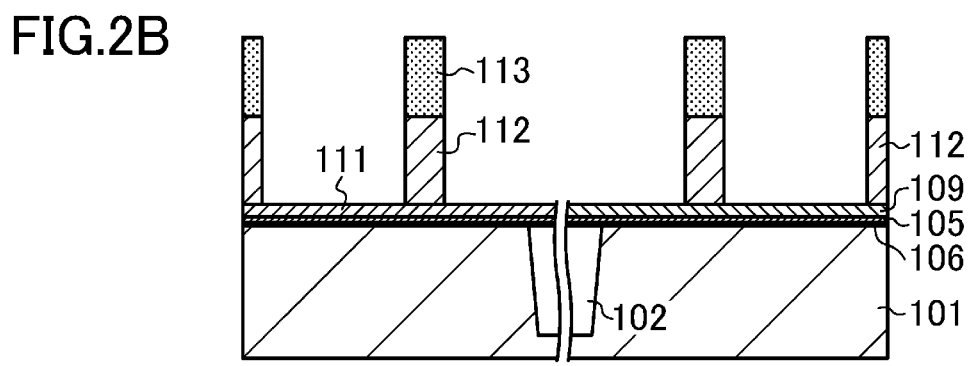

Next, as shown in FIG. 2B, the gate electrode material 112 is processed into a gate electrode shape by anisotropic dry etching, and the etching is stopped on the top surfaces of the pMIS metal material 109 and the nMIS metal material 111. Note that, by appropriately additionally performing a thermal treatment etc. during a period of time from the step of depositing the gate electrode material 107 (FIG. 1A) to the step of forming the gate electrode shape (FIG. 2B), the films of the semiconductor substrate 101, the interface layer 106, the pMIS metal material 109, the nMIS metal material 111, and the gate electrode material 112, and interfaces between these films, are stabilized.

Figure 2C:
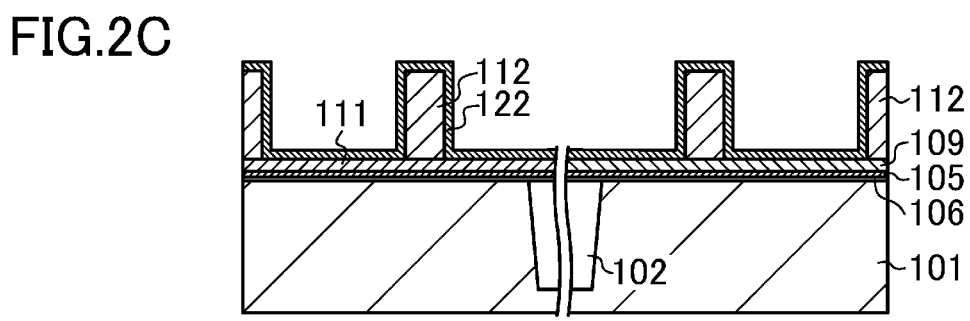

Next, as shown in FIG. 2C, the gate resist pattern 113 is removed, and thereafter, for example, a TiN film having a thickness of about 5-10 nm is formed as a gate sidewall metal layer 122 on gate electrode surfaces (sidewalls and top surfaces) and the top surfaces of the pMIS metal material 109 and the nMIS metal material 111 by chemical vapor deposition (CVD) or atomic layer deposition (ALD). In this case, before the deposition of the gate sidewall metal layer 122, natural oxide is removed from the top surfaces of the pMIS metal material 109 and the nMIS metal material 111 by a washing step using a chemical solution, such as hydrofluoric acid or hydrochloric acid, etc. It is also effective to, before the deposition of the TiN film, remove the natural oxide film by continuously performing a chemical dry treatment (CDT), such as a plasma treatment using a halogen element (e.g., $NF_3$ etc.), etc.

Figure 2D:
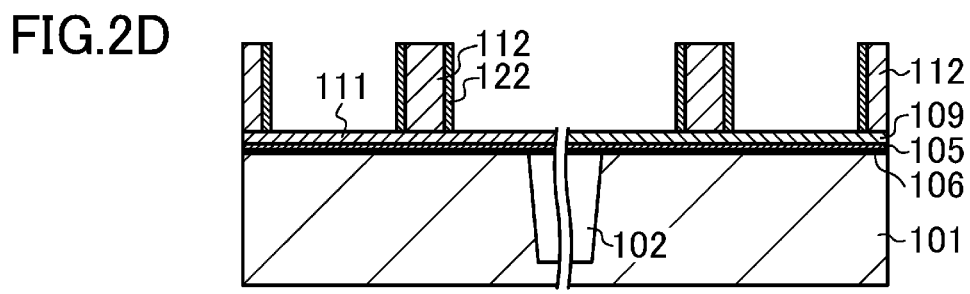

Next, as shown in FIG. 2D, an etch-back process is performed on the TiN film which forms the gate sidewall metal layer 122, to remove the TiN film from the top surfaces of the gate electrodes and the top surfaces of the pMIS metal material 109 and the nMIS metal material 111 while leaving the TiN film only on gate sidewall portions. As a result, bottom portions of the gate sidewall metal layer 122 are connected to the top surfaces of the pMIS metal material 109 and the nMIS metal material 111. Sidewalls of the gate sidewall metal layer 122 are connected to sidewalls of the gate electrode material 112. If the gate electrode material 107 and the gate sidewall metal layer 122 are comprised of the same material, the top surfaces of the pMIS metal material 109 and the nMIS metal material 111 are likely to be slightly etched and removed during the etch-back process, and therefore, the overetch amounts of the pMIS metal material 109 and the nMIS metal material 111 may be reduced by end point detection etc. so that the etch does not reach the gate insulating film 105.

Figure 3A:
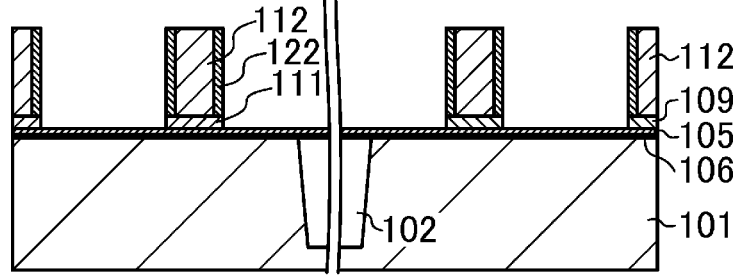
FIGS. 3A-3D are cross-sectional views showing successive steps in the method for fabricating the semiconductor device of the first embodiment of the present disclosure.

Next, as shown in FIG. 3A, the pMIS metal material 109 and the nMIS metal material 111 are removed by anisotropic etching until the gate insulating film 105 is exposed. Next, after the removal of the pMIS metal material 109 and the nMIS metal material 111, the exposed gate insulating film 105, and the interface layer 106 located therebelow, are removed by wet etching etc.

Figure 3B:
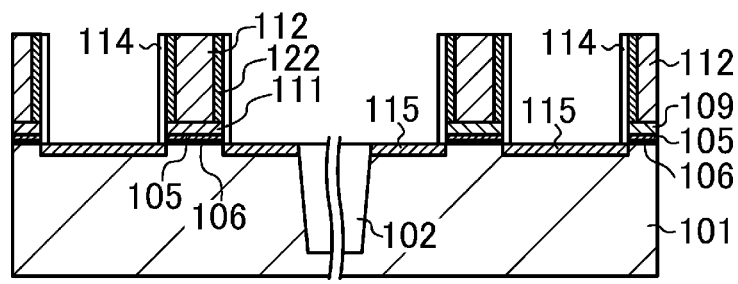

Next, as shown in FIG. 3B, an insulating film (e.g., a TEOS film or a SiN film, etc.) having a thickness of about 5-20 nm is deposited on an entire surface of the semiconductor substrate 101 by low-pressure chemical vapor deposition (LPCVD). An etch-back process is performed by anisotropic dry etching to form offset sidewalls 114 on the sidewalls of the gate sidewall metal layer 122, the pMIS metal material 109 or the nMIS metal material 111, the gate insulating film 105, and the interface layer 106. Next, an extension implantation layer 115 is formed in the regions 100N and 100P by implanting respective desired ions thereinto.

Figure 3C:
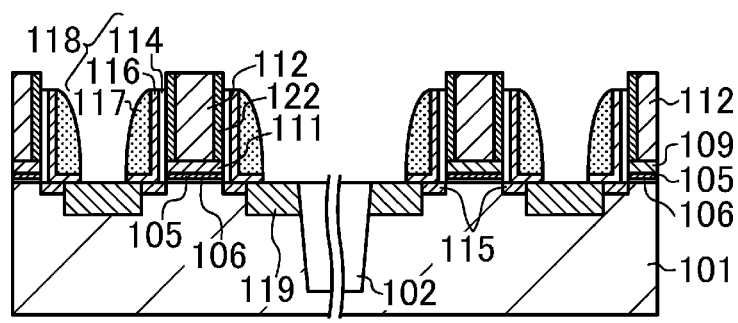

Next, as shown in FIG. 3C, an oxide film (e.g., a TEOS film formed by LPCVD or an NSG film formed by sub-atmospheric chemical vapor deposition (SACVD), etc.) having a thickness of about 5-20 nm is deposited as a lower sidewall film 116 on an entire surface of the semiconductor substrate 101. Thereafter, an insulating film (e.g., an atomic layer deposition-SiN (ALD-SiN) film etc.) having a thickness of, for example, about 20-40 nm is deposited as an upper sidewall film 117. Next, an etch-back process is performed by anisotropic dry etching on the multilayer film of the lower sidewall film 116 and the upper sidewall film 117 to form sidewalls 118 including the offset sidewall 114, the lower sidewall film 116, and the upper sidewall film 117. Next, arsenic (As) ions are implanted into the region 100N at a dose of about $1\text{-}5\times10^{15}$ atoms/cm$^2$ with an implantation energy of about 10-25 keV, or phosphorus (P) ions are implanted into the region 100N at a dose of about $1\text{-}5\times10^{15}$ atoms/cm$^2$ with an implantation energy of about 5-15 keV. Boron (B) ions are implanted into the region 100P at a dose of about $1\text{-}5\times10^{15}$ atoms/cm$^2$ with an implantation energy of about 1-3 keV. As a result, a source/drain implantation layer 119 is formed. Next, the impurities introduced by the ion implantation are activated by an activation thermal treatment. Note that, during this ion implantation, the ions are also simultaneously implanted into the gate electrode surfaces (not shown). Next, the impurities introduced by the ion implantation are activated by performing an activation thermal treatment at high temperature (1000° C. or more) for a short time by lamp heating or laser heating.

Figure 3D:
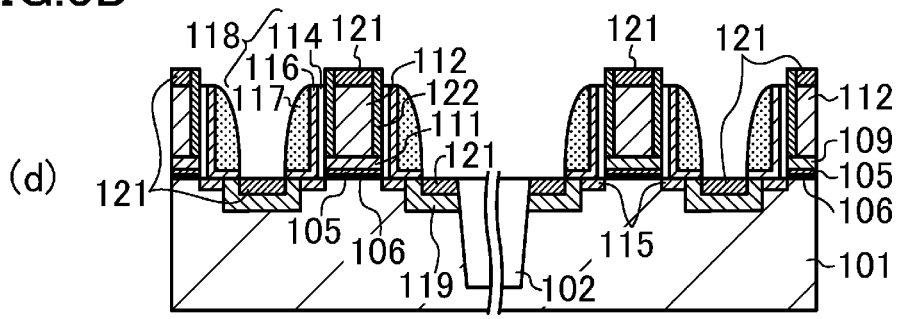

Next, as shown in FIG. 3D, a film of Ni, which is a high melting point metal, having a thickness of about 5-20 nm is deposited by sputtering on an entire surface of the semiconductor substrate 101, and a thermal treatment for silicidation is then performed. Next, an unreacted region after the silicidation is removed by wet etching, and a thermal treatment is then appropriately performed. As a result, a silicide layer 121 formed of the Ni film is formed in each of a surface of the source/drain implantation layer 119 in the surface of the semiconductor substrate 101 and a surface of the gate electrode material 112. Note that when the unreacted region after the silicidation is removed by wet etching, the etch amount of the gate sidewall metal layer 122 is reduced by using a chemical solution having an etch selectivity ratio with respect to the Ni film (high melting point metal) and the gate sidewall metal layer 122. For example, if the high melting point metal is formed of a Ni film and the gate sidewall metal layer 122 is formed of a TiN film, an acid solution such as hydrochloric acid etc. may be used.

Thus, the sidewall of the gate sidewall metal layer 122 is connected to the sidewall of the silicide layer 121 on the gate electrode. In the region 100P, the pMIS metal material (metal electrode layer) 109 provided on the top surface of the gate insulating film 105 and the silicide layer (electrode layer) 121 provided on the top surface of the gate electrode are physically coupled together by the gate sidewall metal layer (metal layer) 122. In the region 100N, the nMIS metal material (metal electrode layer) 111 provided on the top surface of the gate insulating film 105 and the silicide layer (electrode layer) 121 provided on the top surface of the gate electrode are physically coupled together by the gate sidewall metal layer (metal layer) 122. Therefore, even if a multilayer structure including an interface between the metal layer and the silicon layer is present in the metal gate electrode, a connection resistance to the metal layer on the gate insulating film can be reduced irrespective of the resistance value, implantation distribution, or material of the silicon layer in the gate electrode.

As a result, a high-performance device can be obtained in which a degradation in characteristics, such as a transistor delay during high-speed operation or variations in transistor characteristics, etc., is not likely to occur, and which has a low-cost structure.

—Variation (1) of First Embodiment—

A method for fabricating a semiconductor device according to a variation (1) of the first embodiment of the present disclosure will be described hereinafter with reference to the drawings.

FIGS. 4A-4D, 5A-5D, 6A-6D, and 7A are cross-sectional views showing successive steps in the method for fabricating the semiconductor device of the variation (1) of the first embodiment of the present disclosure.

Figure 4A:
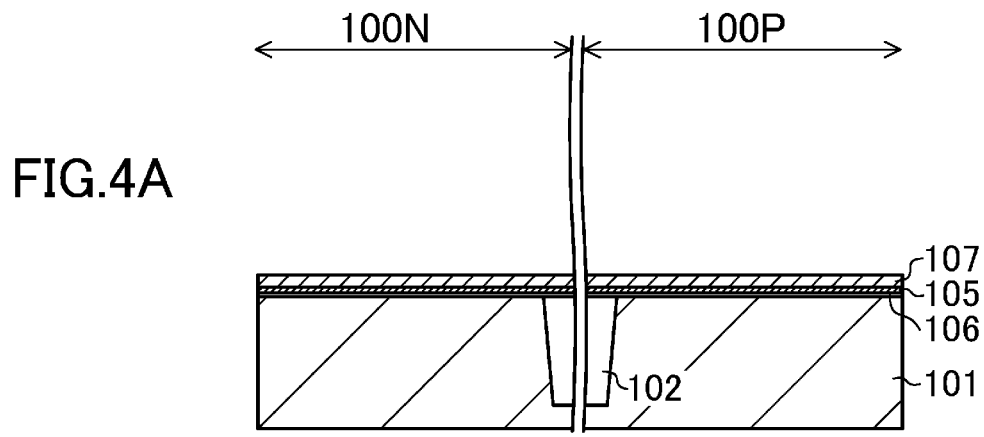
FIGS. 4A-4D are cross-sectional views showing successive steps in a method for fabricating a semiconductor device according to a variation (1) of the first embodiment of the present disclosure.

Initially, a step shown in FIG. 4A is performed. Note that this step is similar to that of FIG. 1A and will not be described.

Figure 4B:
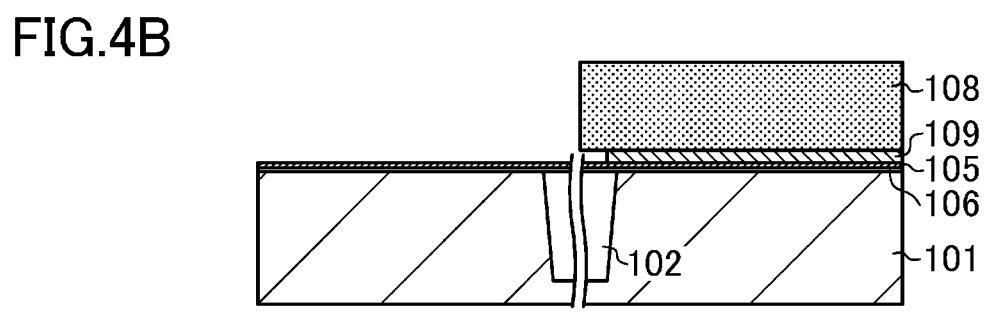

Next, as shown in FIG. 4B, a resist pattern 108 having an opening only in the region 100N is formed, and thereafter, the gate electrode material 107 in the region 100N is removed by wet etching with hydrochloric acid etc. using the resist pattern 108 as a mask to form a pMIS metal material 109 in the region 100N.

Figure 4C:
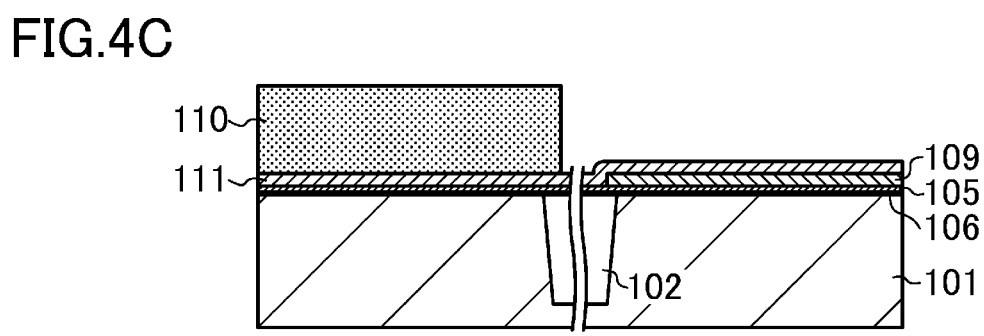

Next, as shown in FIG. 4C, a Ti metal film having a thickness of about 5-20 nm is deposited as an nMIS electrode metal material 111 on an entire surface of the semiconductor substrate 101, and thereafter, a resist pattern 110 having an opening only in the region 100P is formed.

Figure 4D:
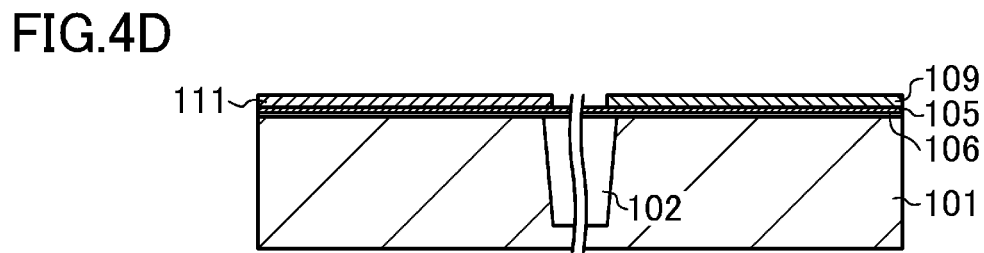

Next, as shown in FIG. 4D, the Ti metal film in the region 100P is removed by wet etching with hydrochloric acid using the resist pattern 110 as a mask to form an nMIS metal material 111 in the region 100N. Here, although the pMIS metal material 109 is formed of the TiN film and the nMIS metal material 111 is formed of the Ti film, only the Ti film can be removed by wet etching using an acid solution (e.g., hydrochloric acid etc.) having an appropriate pH and concentration. Note that if the etch selectivity ratio with respect to the pMIS metal material 109 and the nMIS metal material 111 is low, an etch-resistant film may be additionally formed on the top surface of the pMIS metal material 109 before the wet etching, whereby a shape similar to that which is formed by this step can be formed.

Figure 5A:
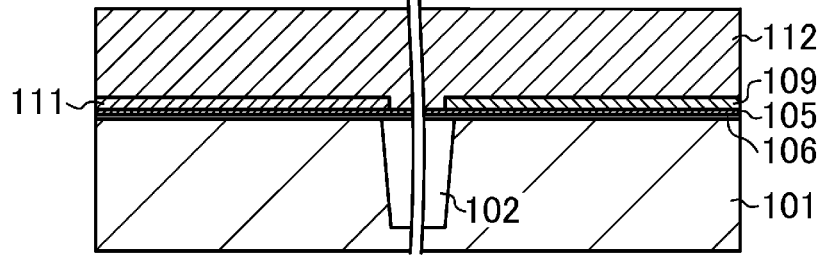
FIGS. 5A-5D are cross-sectional views showing successive steps in the method for fabricating the semiconductor device of the variation (1) of the first embodiment of the present disclosure.

Next, as shown in FIG. 5A, an undoped polysilicon film is deposited as a gate electrode material 112 on an entire surface of the semiconductor substrate 101.

Figure 5B:
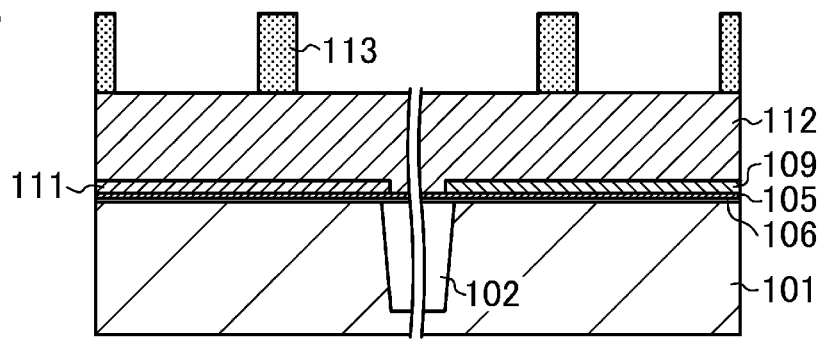

Next, as shown in FIG. 5B, a gate resist pattern 113 is formed on the gate electrode material 112.

Figure 5C:
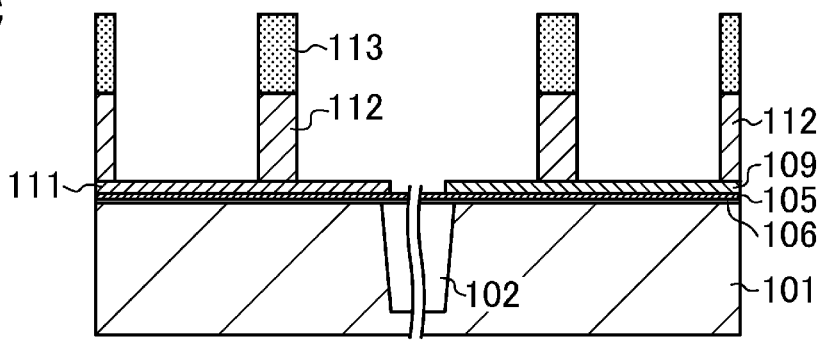

Next, as shown in FIG. 5C, the gate electrode material 112 is processed into a gate electrode shape by anisotropic dry etching, and the etching is stopped on the top surfaces of the pMIS metal material 109 and the nMIS metal material 111. Note that, by appropriately additionally performing a thermal treatment etc. during a period of time from the step of depositing the gate electrode material 107 (FIG. 4A) to the step of forming the gate electrode shape (FIG. 5C), the films of the semiconductor substrate 101, the interface layer 106, the pMIS metal material 109, the nMIS metal material 111, and the gate electrode material 112, and interfaces between these films, are stabilized.

Figure 5D:
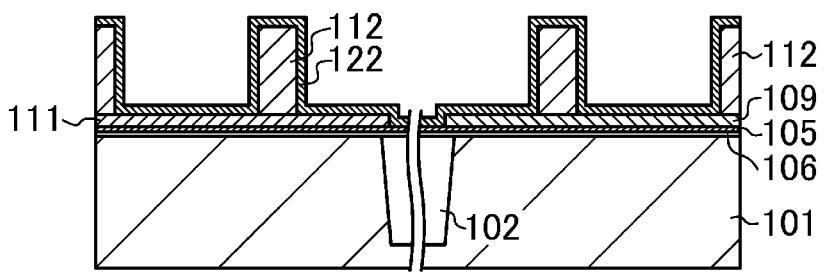

Next, as shown in FIG. 5D, the gate resist pattern 113 is removed, and thereafter, for example, a TiN film having a thickness of about 5-10 nm is formed as a gate sidewall metal layer 122 on gate electrode surfaces (sidewalls and top surfaces) and the top surfaces of the pMIS metal material 109 and the nMIS metal material 111 by chemical vapor deposition (CVD) or atomic layer deposition (ALD). In this case, before the deposition of the gate sidewall metal layer 122, natural oxide is removed from the top surfaces of the pMIS metal material 109 and the nMIS metal material 111 by a washing step using a chemical solution, such as hydrofluoric acid or hydrochloric acid, etc. It is also effective to, before the deposition of the TiN film, remove the natural oxide film by continuously performing a chemical dry treatment (CDT), such as a plasma treatment using a halogen element (e.g., $NF_3$ etc.), etc.

Figure 6A:
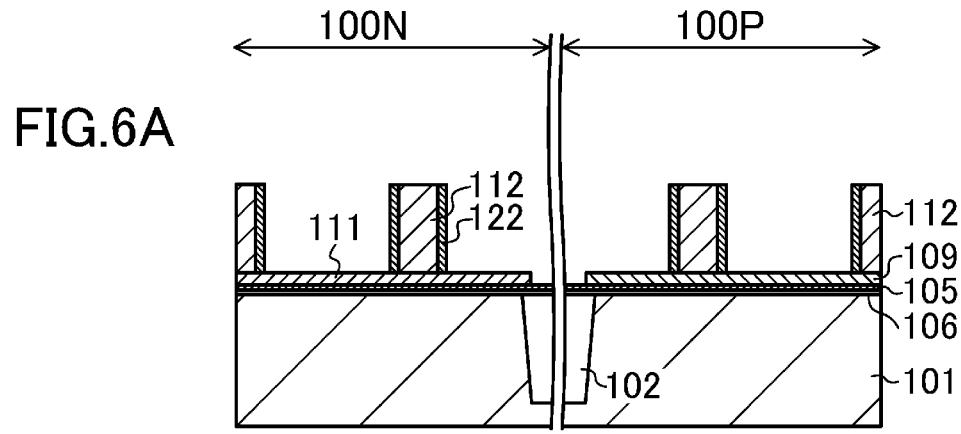
FIGS. 6A-6D are cross-sectional views showing successive steps in the method for fabricating the semiconductor device of the variation (1) of the first embodiment of the present disclosure.

Next, as shown in FIG. 6A, an etch-back process is performed on the TiN film which forms the gate sidewall metal layer 122, to remove the TiN film from the top surfaces of the gate electrodes and the top surfaces of the pMIS metal material 109 and the nMIS metal material 111 while leaving the TiN film only on gate sidewall portions. As a result, bottom portions of the gate sidewall metal layer 122 are connected to the top surfaces of the pMIS metal material 109 and the nMIS metal material 111. Sidewalls of the gate sidewall metal layer 122 are connected to sidewalls of the gate electrode material 112. If the gate electrode material 107 and the gate sidewall metal layer 122 are comprised of the same material, the top surfaces of the pMIS metal material 109 and the nMIS metal material 111 are likely to be slightly etched and removed during the etch-back process, and therefore, the overetch amounts of the pMIS metal material 109 and the nMIS metal material 111 may be reduced by end point detection etc. so that the etch does not reach the gate insulating film 105.

Figure 6B:
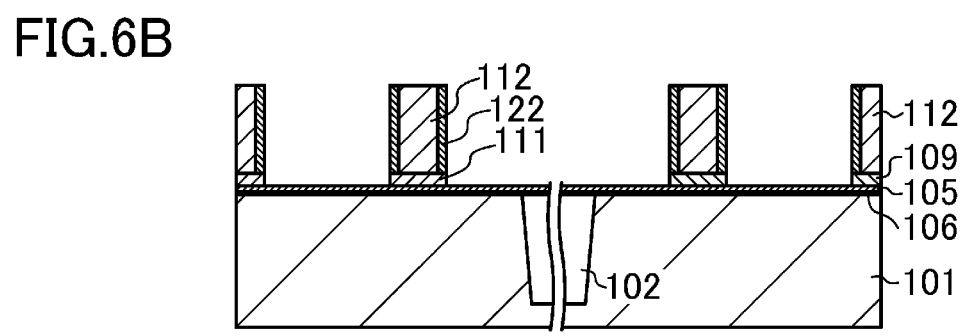

Next, as shown in FIG. 6B, the pMIS metal material 109 and the nMIS metal material 111 are removed by anisotropic etching until the gate insulating film 105 is exposed. Next, after the removal of the pMIS metal material 109 and the nMIS metal material 111, the exposed gate insulating film 105, and the interface layer 106 located therebelow, are removed by wet etching etc.

Figure 6C:
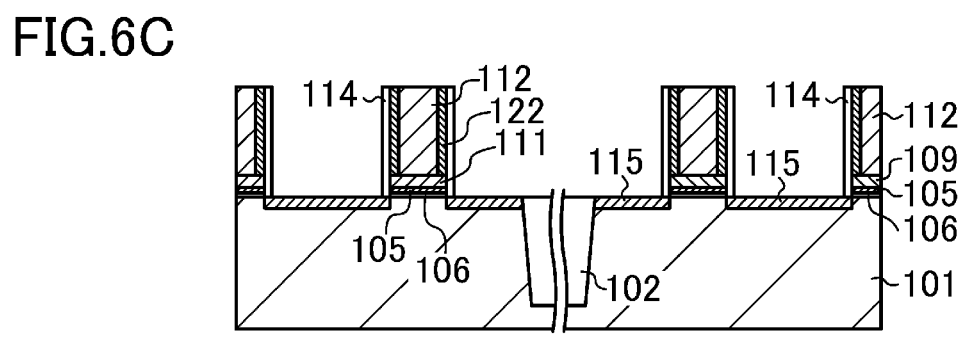

Next, as shown in FIG. 6C, an insulating film (e.g., a TEOS film or a SiN film, etc.) having a thickness of about 5-20 nm is deposited on an entire surface of the semiconductor substrate 101 by low-pressure chemical vapor deposition (LPCVD). An etch-back process is performed by anisotropic dry etching to form offset sidewalls 114 on sidewalls of the gate sidewall metal layer 122, the pMIS metal material 109 or the nMIS metal material 111, the gate insulating film 105, and the interface layer 106. Next, an extension implantation layer 115 is formed in the regions 100N and 100P by implanting respective desired ions thereinto.

Figure 6D:
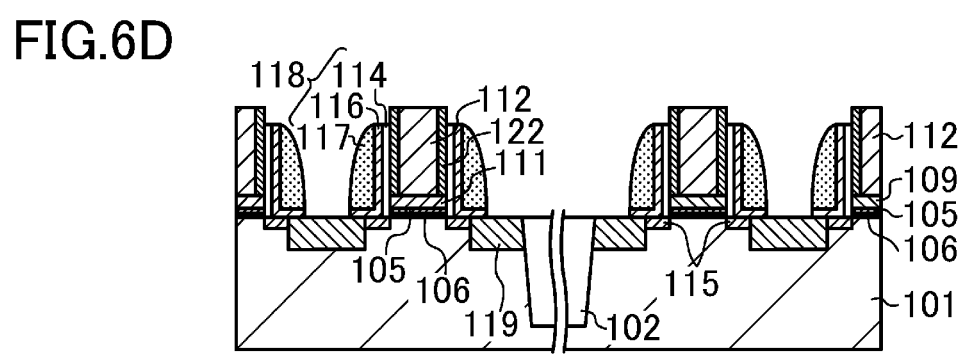

Next, as shown in FIG. 6D, an oxide film (e.g., a TEOS film formed by LPCVD or an NSG film formed by sub-atmospheric chemical vapor deposition (SACVD), etc.) having a thickness of about 5-20 nm is deposited as a lower sidewall film 116 on an entire surface of the semiconductor substrate 101. Thereafter, an insulating film (e.g., an atomic layer deposition-SiN (ALD-SiN) film etc.) having a thickness of, for example, about 20-40 nm is deposited as an upper sidewall film 117. Next, an etch-back process is performed by anisotropic dry etching on the multilayer film of the lower sidewall film 116 and the upper sidewall film 117 to form sidewalls 118 including the offset sidewall 114, the lower sidewall film 116, and the upper sidewall film 117. Next, arsenic (As) ions are implanted into the region 100N at a dose of about $1-5 \times 10^{15}$ atoms/cm$^2$ with an implantation energy of about 10-25 keV, or phosphorus (P) ions are implanted into the region 100N at a dose of about $1-5 \times 10^{15}$ atoms/cm$^2$ with an implantation energy of about 5-15 keV. Boron (B) ions are implanted into the region 100P at a dose of about $1-5 \times 10^{15}$ atoms/cm$^2$ with an implantation energy of about 1-3 keV. As a result, a source/drain implantation layer 119 is formed. Next, the impurities introduced by the ion implantation are activated by an activation thermal treatment. Note that, during this ion implantation, the ions are also simultaneously implanted into the gate electrode surfaces (not shown). Next, the impurities introduced by the ion implantation are activated by performing an activation thermal treatment at high temperature (1000° C. or more) for a short time by lamp heating or laser heating.

Figure 7A:
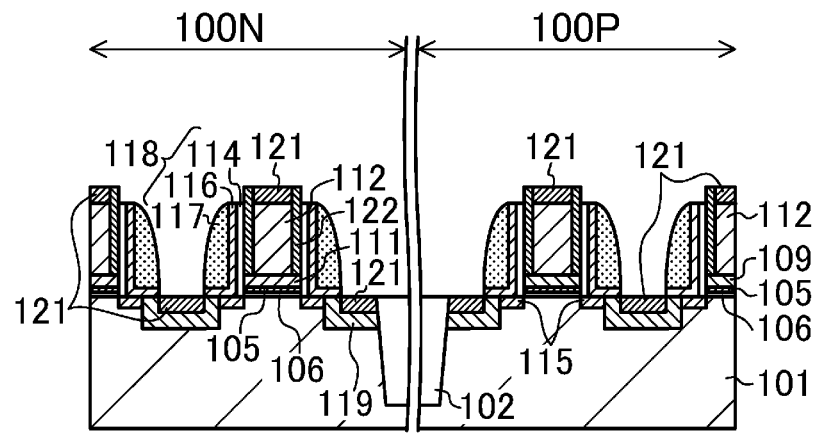
FIG. 7A is a cross-sectional view showing successive steps in the method for fabricating the semiconductor device of the variation (1) of the first embodiment of the present disclosure.

Next, as shown in FIG. 7A, a film of Ni, which is a high melting point metal, having a thickness of about 5-20 nm is deposited by sputtering on an entire surface of the semiconductor substrate 101, and a thermal treatment for silicidation is then performed. Next, an unreacted region after the silicidation is removed by wet etching, and a thermal treatment is then appropriately performed. As a result, a silicide layer 121 formed of the Ni film is formed in each of a surface of the source/drain implantation layer 119 in the surface of the semiconductor substrate 101 and a surface of the gate electrode material 112. Note that when the unreacted region after the silicidation is removed by wet etching, the etch amount of the gate sidewall metal layer 122 is reduced by using a chemical solution having an etch selectivity ratio with respect to the Ni film (high melting point metal) and the gate sidewall metal layer 122. For example, if the high melting point metal is formed of a Ni film and the gate sidewall metal layer 122 is formed of a TiN film, an acid solution such as hydrochloric acid etc. may be used.

Thus, the sidewall of the gate sidewall metal layer 122 is connected to the sidewall of the silicide layer 121 on the gate electrode. In the region 100P, the pMIS metal material (metal electrode layer) 109 provided on the top surface of the gate insulating film 105 and the silicide layer (electrode layer) 121 provided on the top surface of the gate electrode are physically coupled together by the gate sidewall metal layer (metal layer) 122. In the region 100N, the nMIS metal material (metal electrode layer) 111 provided on the top surface of the gate insulating film 105 and the silicide layer (electrode layer) 121 provided on the top surface of the gate electrode are physically coupled together by the gate sidewall metal layer (metal layer) 122. Therefore, even if a multilayer structure including an interface between the metal layer and the silicon layer is present in the metal gate electrode, a connection resistance to the metal layer on the gate insulating film can be reduced irrespective of the resistance value, implantation distribution, or material of the silicon layer in the gate electrode. As a result, a high-performance device can be obtained in which a degradation in characteristics, such as a transistor delay during high-speed operation or variations in transistor characteristics, etc., is not likely to occur, and which has a low-cost structure.

Figure 7B:
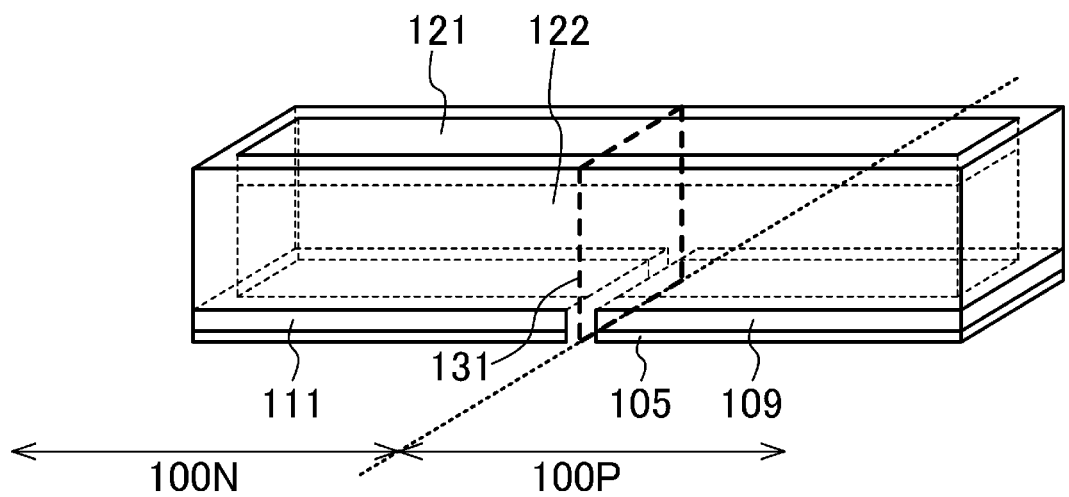
FIG. 7B is a bird's eye view of a structure of FIG. 7A.

Here, FIG. 7B is a bird's eye view of the gate electrode of FIG. 7A formed by the method for fabricating the semiconductor device of the variation (1) (note that, for the sake of simplicity, the substrate and the sidewall are not shown).

As shown in FIG. 7B, in the gate electrode straddling the regions 100N and 100P, even if the pMIS metal material 109 and the nMIS metal material 111 are disconnected in a plane perpendicular to the main surface of the semiconductor substrate 101, the gate sidewall metal layer 122 is connected directly to the pMIS metal material 109 and the nMIS metal material 111. Therefore, for example, even if an in-gate perpendicular PN junction 131 is present in the gate electrode material 112 or the gate electrode material 112 has a high resistance, a current flow is not hindered or does not need to make a detour. As a result, a high-performance device (particularly, a CMOS device etc.) can be obtained in which a degradation in characteristics, such as a transistor delay during high-speed operation or variations in transistor characteristics, etc., is not likely to occur, and which has a low-cost structure.

(Second Embodiment)

A semiconductor device according to a second embodiment of the present disclosure and a method for fabricating the semiconductor device will be described hereinafter with reference to the drawings.

FIGS. 8A-8D and 9A-9D are cross-sectional views showing successive steps in the method for fabricating the semiconductor device of the second embodiment of the present disclosure. Note that, in each figure, a region on the left-hand side of the drawing sheet is a region 100N in which an n-channel MIS transistor is formed, and a region on the right-hand side of the drawing sheet is a region 100P in which a p-channel MIS transistor is formed.

Initially, the steps of FIGS. 1A-2A are performed. Note that these steps have been described in the first embodiment and will not be described. Note that, in this embodiment, a width of the resist pattern formed in the step of FIG. 2A is slightly made larger so that an eventual gate electrode has a gate length similar to that of the gate electrode of the first embodiment. The present disclosure is not limited to this.

Next, as shown in FIG. 8A, the gate electrode material 112 is processed into a gate electrode shape by anisotropic dry etching, and the etching is stopped on the top surfaces of the pMIS metal material 109 and the nMIS metal material 111. Note that, similarly, by appropriately additionally performing a thermal treatment etc. during a period of time from the step of depositing the gate electrode material 107 (FIG. 1A) to the step of forming the gate electrode shape (FIG. 2B), the films of the semiconductor substrate 101, the interface layer 106, the pMIS metal material 109, the nMIS metal material 111, and the gate electrode material 112, and interfaces between these films, are stabilized.

Next, as shown in FIG. 8B, the gate resist pattern 113 is removed, and thereafter, for example, a Ni film having a thickness of about 5-10 nm is formed as a gate sidewall metal layer 122 on gate electrode surfaces (sidewalls and top surfaces) and the top surfaces of the pMIS metal material 109 and the nMIS metal material 111 by chemical vapor deposition (CVD) or atomic layer deposition (ALD). In this case, before the deposition of the gate sidewall metal layer 122, natural oxide is removed from the top surfaces of the pMIS metal material 109 and the nMIS metal material 111 by a washing step using a chemical solution, such as hydrofluoric acid or hydrochloric acid, etc. It is also effective to, before the deposition of the Ni film, remove the natural oxide film by continuously performing a chemical dry treatment (CDT), such as a plasma treatment using a halogen element (e.g., $NF_3$ etc.), etc.

Next, as shown in FIG. 8C, an etch-back process is performed on the Ni film which forms the gate sidewall metal layer 122, to remove the Ni film from the top surfaces of the gate electrodes and the top surfaces of the pMIS metal material 109 and the nMIS metal material 111 while leaving the Ni film only on gate sidewall portions.

Next, as shown in FIG. 8D, a thermal treatment for silicidation is performed on the Ni film which forms the gate sidewall metal layer 122, to form a Ni silicide layer as a gate sidewall silicide layer 123 on sidewalls of the silicon material which is the gate electrode material 112. In this case, a thickness of the gate sidewall silicide layer 123 can be changed, depending on a thickness, thermal treatment temperature, and thermal treatment time of the gate sidewall metal layer 122. Here, FIG. 8D shows an example in which an entirety of the gate sidewall metal layer 122 is allowed to react as the gate sidewall silicide layer 123 by the thermal treatment for silicidation. Note that even if a portion of the gate sidewall metal layer 122 is allowed to react as the gate sidewall silicide layer 123 by the thermal treatment for silicidation, a shape similar to that which has been described above can be obtained by removing an excessive portion of the gate sidewall metal layer 122 by wet etching using, for example, an acid solution such as hydrochloric acid etc. The temperature and time of the thermal treatment for silicidation are determined based on the thickness or type of the gate sidewall metal layer 122, and if the pMIS metal material 109 and the nMIS metal material 111 are comprised of a material which is transformed into silicide with respect to the gate electrode material 112, may be determined based on conditions for the pMIS metal material 109 and the nMIS metal material 111.

As a result, bottom portions of the gate sidewall silicide layer 123 and the top surfaces of the pMIS metal material 109 and the nMIS metal material 111 are connected together. Sidewalls of the gate sidewall silicide layer 123 are connected to sidewalls of the gate electrode material 112.

Figure 9A:
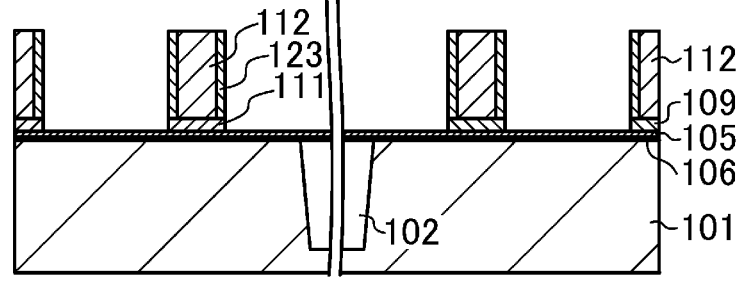
FIGS. 9A-9D are cross-sectional views showing successive steps in the method for fabricating the semiconductor device of the second embodiment of the present disclosure.

Next, as shown in FIG. 9A, the pMIS metal material 109 and the nMIS metal material 111 are removed by anisotropic etching until the gate insulating film 105 is exposed. Next, after the removal of the pMIS metal material 109 and the nMIS metal material 111, the exposed gate insulating film 105, and the interface layer 106 located therebelow, are removed by wet etching etc.

Figure 9B:
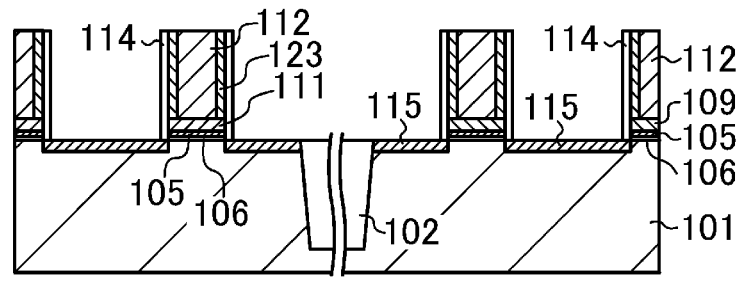

Next, as shown in FIG. 9B, an insulating film (e.g., a TEOS film or a SiN film, etc.) having a thickness of about 5-20 nm is deposited on an entire surface of the semiconductor substrate 101 by low-pressure chemical vapor deposition (LPCVD). An etch-back process is performed by anisotropic dry etching to form offset sidewalls 114 on sidewalls of the gate sidewall silicide layer 123, the pMIS metal material 109 or the nMIS metal material 111, the gate insulating film 105, and the interface layer 106. Next, an extension implantation layer 115 is formed in the regions 100N and 100P by implanting respective desired ions thereinto.

Figure 9C:
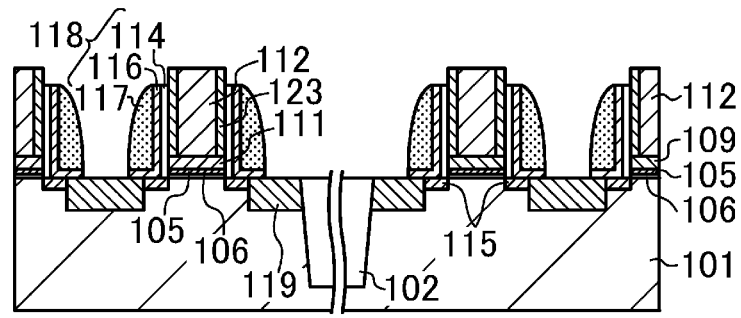

Next, as shown in FIG. 9C, an oxide film (e.g., a TEOS film formed by LPCVD or an NSG film formed by sub-atmospheric chemical vapor deposition (SACVD), etc.) having a thickness of about 5-10 nm is deposited as a lower sidewall film 116 on an entire surface of the semiconductor substrate 101. Thereafter, an insulating film (e.g., an atomic layer deposition-SiN (ALD-SiN) film etc.) having a thickness of, for example, about 20-40 nm is deposited as an upper sidewall film 117. Next, an etch-back process is performed by anisotropic dry etching on the multilayer film of the lower sidewall film 116 and the upper sidewall film 117 to form sidewalls 118 including the offset sidewall 114, the lower sidewall film 116, and the upper sidewall film 117. Next, arsenic (As) ions are implanted into the region 100N at a dose of about $1-5\times10^{15}$ atoms/cm$^2$ with an implantation energy of about 10-25 keV, or phosphorus (P) ions are implanted into the region 100N at a dose of about $1-5\times10^{15}$ atoms/cm$^2$ with an implantation energy of about 5-15 keV. Boron (B) ions are implanted into the region 100P at a dose of about $1-5\times10^{15}$ atoms/cm$^2$ with an implantation energy of about 1-3 keV. As a result, a source/drain implantation layer 119 is formed. Next, the impurities introduced by the ion implantation are activated by an activation thermal treatment. Note that, during this ion implantation, the ions are also simultaneously implanted into the gate electrode surfaces (not shown). Next, the impurities introduced by the ion implantation are activated by performing an activation thermal treatment at high temperature (1000° C. or more) for a short time by lamp heating or laser heating.

Figure 9D:
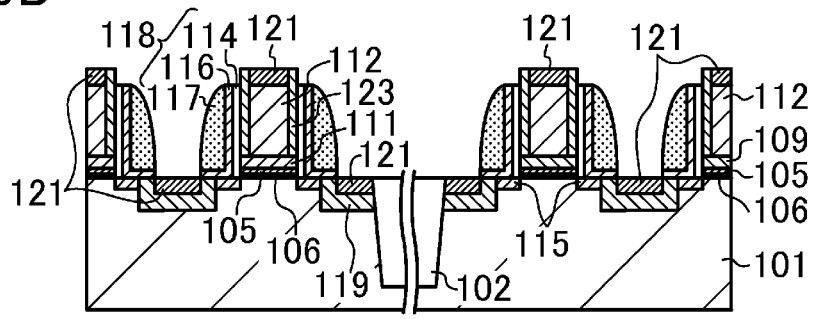

Next, as shown in FIG. 9D, a film of Ni, which is a high melting point metal, having a thickness of about 5-20 nm is deposited by sputtering on an entire surface of the semiconductor substrate 101, and a thermal treatment for silicidation is then performed. Next, an unreacted region after the silicidation is removed by wet etching, and a thermal treatment is then appropriately performed. As a result, a Ni silicide layer 121 is formed in each of a surface of the source/drain implantation layer 119 in the surface of the semiconductor substrate 101 and a surface of the gate electrode material 112. Note that when the unreacted region after the silicidation is removed by wet etching, the etch amount of the gate sidewall silicide layer 123 is reduced by using a chemical solution having an etch selectivity ratio with respect to the Ni film (high melting point metal) and the gate sidewall silicide layer 123.

Thus, the sidewall of the gate sidewall silicide layer 123 is connected to the sidewall of the silicide layer 121 on the gate electrode. In the region 100P, the pMIS metal material (metal electrode layer) 109 provided on the top surface of the gate insulating film 105 and the silicide layer (electrode layer) 121 provided on the top surface of the gate electrode are physically coupled together by the gate sidewall silicide layer (metal layer) 123. In the region 100N, the nMIS metal material (metal electrode layer) 111 provided on the top surface of the gate insulating film 105 and the silicide layer (electrode layer) 121 provided on the top surface of the gate electrode are physically coupled together by the gate sidewall silicide layer (metal layer) 123. Therefore, even if a multilayer structure including an interface between the metal layer and the silicon layer is present in the metal gate electrode, a connection resistance to the metal layer on the gate insulating film can be reduced irrespective of the resistance value, implantation distribution, or material of the silicon layer in the gate electrode. As a result, a high-performance device can be obtained in which a degradation in characteristics, such as a transistor delay during high-speed operation or variations in transistor characteristics, etc., is not likely to occur, and which has a low-cost structure.

—Variation (2) of Second Embodiment—

A method for fabricating a semiconductor device according to a variation (2) of the second embodiment of the present disclosure will be described hereinafter with reference to the drawings.

FIGS. 10A-10D, 11A-11D, and 12A and 12B are cross-sectional views showing successive steps in the method for fabricating the semiconductor device of the variation (2) of the second embodiment of the present disclosure.

Initially, the steps of FIGS. 1A-1D are performed. Note that these steps have been described in the first embodiment and will not be described.

Next, as shown in FIG. 10A, a gate hard mask 126 having a thickness of about 5-30 nm is deposited as an etch hard mask on the gate electrode material 112 formed of an undoped polysilicon film. The gate hard mask 126 is an insulating film which is an oxide film, a nitride film, an oxynitride film, or a multilayer film thereof, etc., and is used as a hard mask during gate etching, and also functions as a silicide protection film in a subsequent step.

Next, as shown in FIG. 10B, a gate resist pattern 113 is formed on the gate electrode material 112. Note that, in this embodiment, a width of the resist pattern formed in the step of FIG. 2A is slightly made larger so that an eventual gate electrode has a gate length similar to that of the gate electrode of the first embodiment. The present disclosure is not limited to this.

Next, as shown in FIG. 10C, the gate hard mask 126 and the gate electrode material 112 are processed into a gate electrode shape by anisotropic dry etching, and the etching is stopped on the top surfaces of the pMIS metal material 109 and the nMIS metal material 111. Note that, similarly, by appropriately additionally performing a thermal treatment etc. during a period of time from the step of depositing the gate electrode material 107 (FIG. 1A) to the step of forming the gate electrode shape (FIG. 2B), the films of the semiconductor substrate 101, the interface layer 106, the pMIS metal material 109, the nMIS metal material 111, and the gate electrode material 112, and interfaces between these films, are stabilized.

Next, as shown in FIG. 10D, the gate resist pattern 113 is removed, and thereafter, for example, a Ni film having a thickness of about 5-10 nm is formed as a gate sidewall metal layer 122 on the top surfaces and sidewalls of the gate hard mask 126, gate electrode sidewalls, and the top surfaces of the pMIS metal material 109 and the nMIS metal material 111 by chemical vapor deposition (CVD) or atomic layer deposition (ALD). In this case, before the deposition of the gate sidewall metal layer 122, natural oxide is removed from the top surfaces of the pMIS metal material 109 and the nMIS metal material 111 by a washing step using a chemical solution, such as hydrofluoric acid or hydrochloric acid, etc. It is also effective to, before the deposition of the Ni film, remove the natural oxide film by continuously performing a chemical dry treatment (CDT), such as a plasma treatment using a halogen element (e.g., $NF_3$ etc.), etc.

Figure 11A:
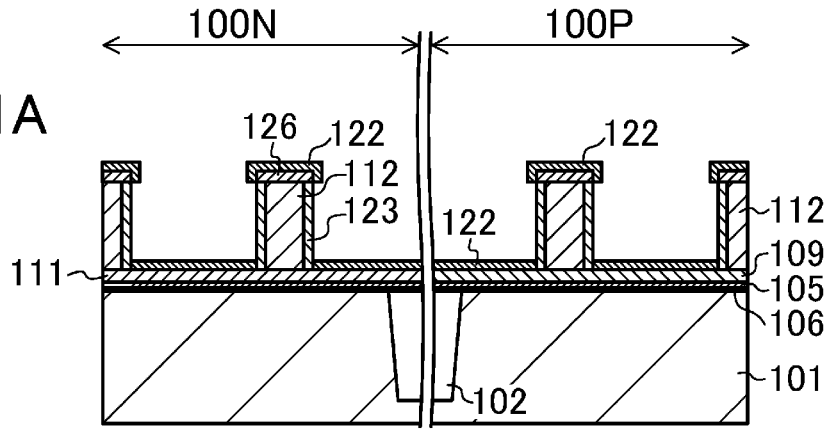
FIGS. 11A-11D are cross-sectional views showing successive steps in the method for fabricating the semiconductor device of the variation (2) of the second embodiment of the present disclosure.

Next, as shown in FIG. 11A, a thermal treatment for silicidation is performed on the Ni film which forms the gate sidewall metal layer 122, to form a Ni silicide layer as a gate sidewall silicide layer 123 on sidewalls of the silicon material which is the gate electrode material 112. In this case, a thickness of the gate sidewall silicide layer 123 can be changed, depending on a thickness, thermal treatment temperature, and thermal treatment time of the gate sidewall metal layer 122. Here, FIG. 11A shows an example in which an entirety of the gate sidewall metal layer 122 is allowed to react as the gate sidewall silicide layer 123 by the thermal treatment for silicidation. Note that the top surface of the gate electrode is protected by the gate hard mask 126 and therefore is not transformed into silicide.

Figure 11B:
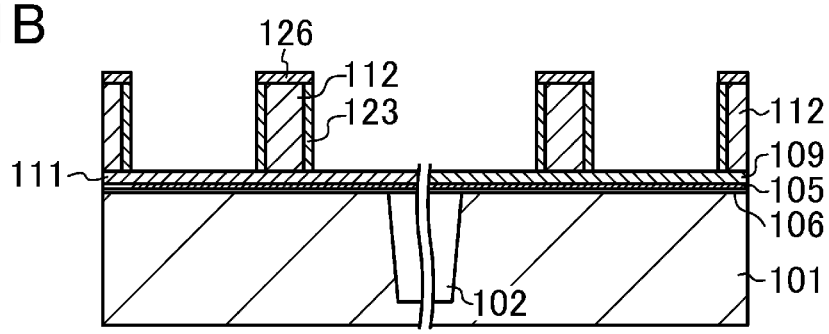

Next, as shown in FIG. 11B, an excessive portion of the gate sidewall metal layer 122 is removed by wet etching using, for example, an acid solution such as hydrochloric acid etc. to remove the gate sidewall silicide layer 123 from the top surfaces of the gate electrodes and the top surfaces of the pMIS metal material 109 and the nMIS metal material 111 while leaving the gate sidewall silicide layer 123 only on the gate sidewalls.

As a result, bottom portions of the gate sidewall silicide layer 123 and the top surfaces of the pMIS metal material 109 and the nMIS metal material 111 are connected together. Sidewalls of the gate sidewall silicide layer 123 are connected to sidewalls of the gate electrode material 112.

Figure 11C:
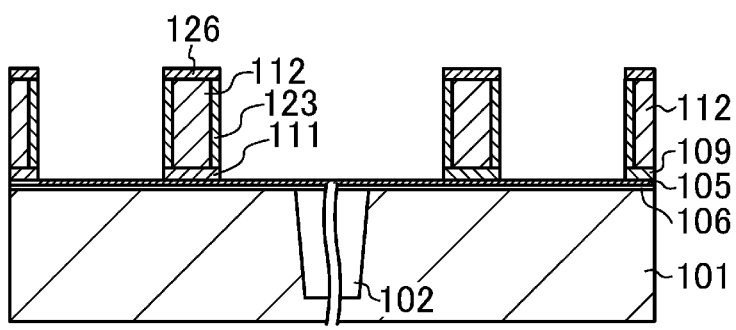

Next, as shown in FIG. 11C, the pMIS metal material 109 and the nMIS metal material 111 are removed by anisotropic etching until the gate insulating film 105 is exposed. Next, after the removal of the pMIS metal material 109 and the nMIS metal material 111, the exposed gate insulating film 105, and the interface layer 106 located therebelow, are removed by wet etching etc.

Figure 11D:
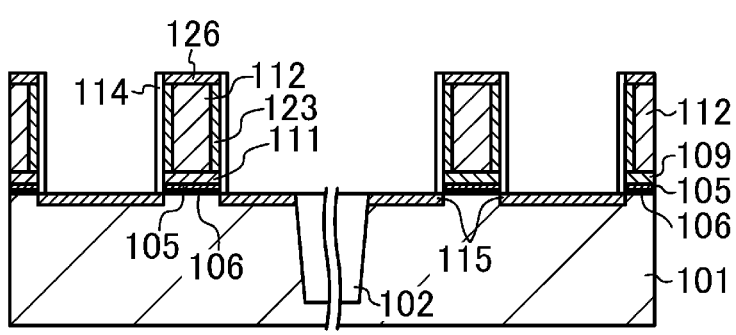

Next, as shown in FIG. 11D, an insulating film (e.g., a TEOS film or a SiN film, etc.) having a thickness of about 5-20 nm is deposited on an entire surface of the semiconductor substrate 101 by low-pressure chemical vapor deposition (LPCVD). An etch-back process is performed by anisotropic dry etching to form offset sidewalls 114 on sidewalls of the gate hard mask 126, the gate sidewall silicide layer 123, the pMIS metal material 109 or the nMIS metal material 111, the gate insulating film 105, and the interface layer 106. Next, an extension implantation layer 115 is formed in the regions 100N and 100P by implanting respective desired ions thereinto.

Figure 12A:
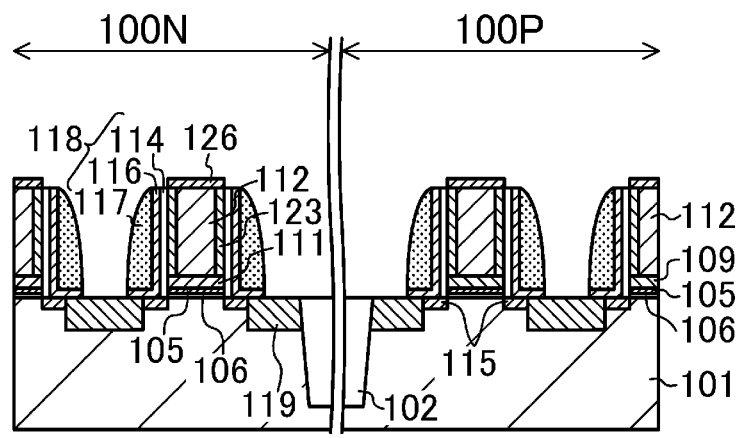
FIGS. 12A and 12B are cross-sectional views showing successive steps in the method for fabricating the semiconductor device of the variation (2) of the second embodiment of the present disclosure.

Next, as shown in FIG. 12A, an oxide film (e.g., a TEOS film formed by LPCVD or an NSG film formed by sub-atmospheric chemical vapor deposition (SACVD), etc.) having a thickness of about 5-10 nm is deposited as a lower sidewall film 116 on an entire surface of the semiconductor substrate 101. Thereafter, an insulating film (e.g., an atomic layer deposition-SiN (ALD-SiN) film etc.) having a thickness of, for example, about 20-40 nm is deposited as an upper sidewall film 117. Next, an etch-back process is performed by anisotropic dry etching on the multilayer film of the lower sidewall film 116 and the upper sidewall film 117 to form sidewalls 118 including the offset sidewall 114, the lower sidewall film 116, and the upper sidewall film 117. Next, arsenic (As) ions are implanted into the region 100N at a dose of about $1-5\times10^{15}$ atoms/cm$^2$ with an implantation energy of about 10-25 keV, or phosphorus (P) ions are implanted into the region 100N at a dose of about $1-5\times10^{15}$ atoms/cm$^2$ with an implantation energy of about 5-15 keV. Boron (B) ions are implanted into the region 100P at a dose of about $1-5\times10^{15}$ atoms/cm$^2$ with an implantation energy of about 1-3 keV. As a result, a source/drain implantation layer 119 is formed. Next, the impurities introduced by the ion implantation are activated by an activation thermal treatment. Note that, during this ion implantation, the ions are also simultaneously implanted into the gate electrode surfaces (not shown). Next, the impurities introduced by the ion implantation are activated by performing an activation thermal treatment at high temperature (1000° C. or more) for a short time by lamp heating or laser heating.

Figure 12B:
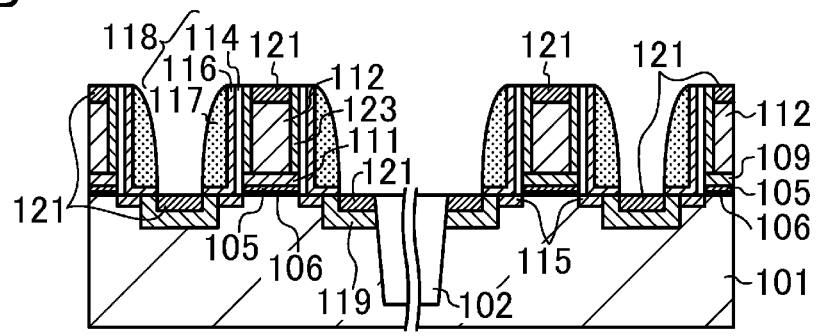

Next, as shown in FIG. 12B, a film of Ni, which is a high melting point metal, having a thickness of about 5-20 nm is deposited by sputtering on an entire surface of the semiconductor substrate 101, and a thermal treatment for silicidation is then performed. Next, an unreacted region after the silicidation is removed by wet etching, and a thermal treatment is then appropriately performed. As a result, a Ni silicide layer 121 is formed in each of a surface of the source/drain implantation layer 119 in the surface of the semiconductor substrate 101 and a surface of the gate electrode material 112. Note that when the unreacted region after the silicidation is removed by wet etching, the etch amount of the gate sidewall silicide layer 123 is reduced by using a chemical solution having an etch selectivity ratio with respect to the Ni film (high melting point metal) and the gate sidewall silicide layer 123.

Thus, the sidewall of the gate sidewall silicide layer 123 is connected to the sidewall of the silicide layer 121 on the gate electrode. In the region 100P, the pMIS metal material (metal electrode layer) 109 provided on the top surface of the gate insulating film 105 and the silicide layer (electrode layer) 121 provided on the top surface of the gate electrode are physically coupled together by the gate sidewall silicide layer (metal layer) 123. In the region 100N, the nMIS metal material (metal electrode layer) 111 provided on the top surface of the gate insulating film 105 and the silicide layer (electrode layer) 121 provided on the top surface of the gate electrode are physically coupled together by the gate sidewall silicide layer (metal layer) 123. Therefore, even if a multilayer structure including an interface between the metal layer and the silicon layer is present in the metal gate electrode, a connection resistance to the metal layer on the gate insulating film can be reduced irrespective of the resistance value, implantation distribution, or material of the silicon layer in the gate electrode. As a result, a high-performance device can be obtained in which a degradation in characteristics, such as a transistor delay during high-speed operation or variations in transistor characteristics, etc., is not likely to occur, and which has a low-cost structure.

(Third Embodiment)

A semiconductor device according to a third embodiment of the present disclosure and a method for fabricating the semiconductor device will be described hereinafter with reference to the drawings.

FIGS. 13A-13D, 14A-14D, and 15 are cross-sectional views showing successive steps in the method for fabricating the semiconductor device of the third embodiment of the present disclosure. Note that, in each figure, a region on the left-hand side of the drawing sheet is a region 100N in which an n-channel MIS transistor is formed, and a region on the right-hand side of the drawing sheet is a region 100P in which a p-channel MIS transistor is formed.

Initially, the steps of FIGS. 1A-1C are performed. Note that these steps have been described in the first embodiment and will not be described.

Figure 13A:
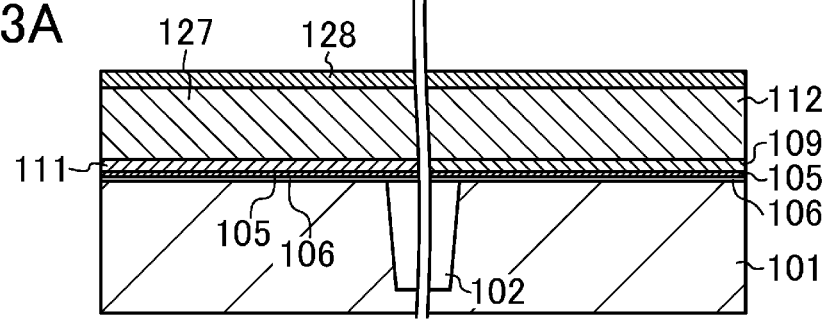
FIGS. 13A-13D are cross-sectional views showing successive steps in a method for fabricating a semiconductor device according to a third embodiment of the present disclosure.

Next, as shown in FIG. 13A, the resist pattern 110 formed in the step of FIG. 1C is removed, and thereafter, a silicon oxide film is deposited as a gate electrode material 127 on an entire surface of the semiconductor substrate 101. Next, an undoped polysilicon film having a thickness of about 5-20 nm is deposited as a gate electrode material 128 on the gate electrode material 127.

Figure 13B:
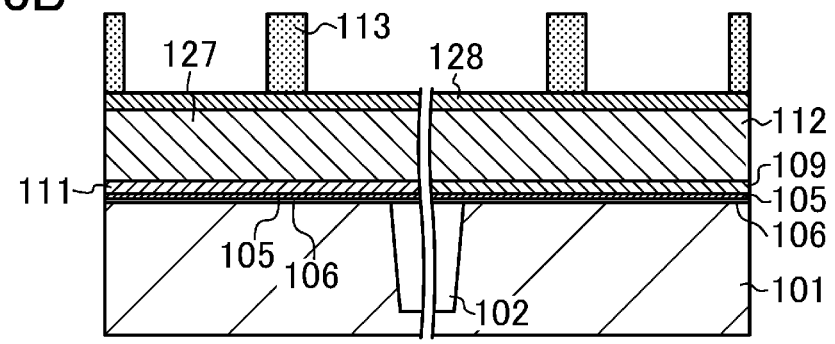

Next, as shown in FIG. 13B, a gate resist pattern 113 is formed on the gate electrode material 128.

Figure 13C:
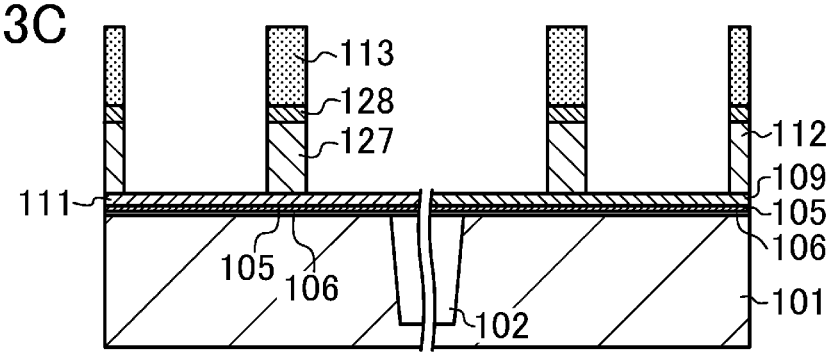

Next, as shown in FIG. 13C, the gate electrode material 128 and the gate electrode material 127 are processed into a gate electrode shape by anisotropic dry etching, and the etching is stopped on the top surfaces of the pMIS metal material 109 and the nMIS metal material 111. Note that, similarly, by appropriately additionally performing a thermal treatment etc. during a period of time from the step of depositing the gate electrode material 107 (FIG. 1A) to the step of forming the gate electrode shape (FIG. 13C), interfaces between the semiconductor substrate 101, the interface layer 106, the pMIS metal material 109, and the nMIS metal material 111 are stabilized.

Figure 13D:
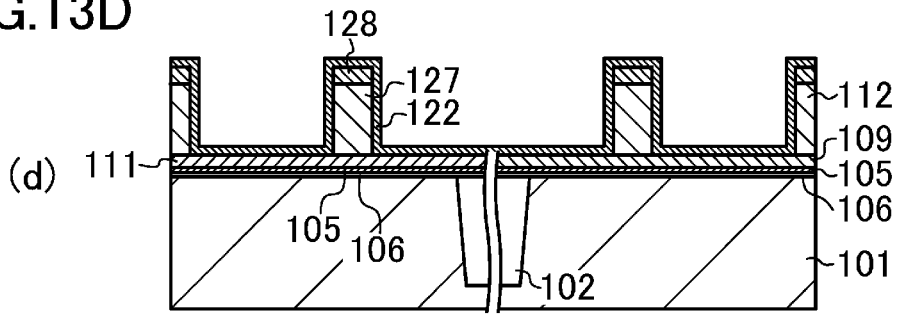

Next, as shown in FIG. 13D, the gate resist pattern 113 is removed, and thereafter, for example, a TiN film having a thickness of about 5-10 nm is formed as a gate sidewall metal layer 122 on the top surfaces and sidewalls of the gate electrode material 128, gate electrode sidewalls, and the top surfaces of the pMIS metal material 109 and the nMIS metal material 111 by chemical vapor deposition (CVD) or atomic layer deposition (ALD). In this case, before the deposition of the gate sidewall metal layer 122, natural oxide is removed from the top surfaces of the pMIS metal material 109 and the nMIS metal material 111 by a washing step using a chemical solution, such as hydrofluoric acid or hydrochloric acid, etc. It is also effective to, before the deposition of the TiN film, remove the natural oxide film by continuously performing a chemical dry treatment (CDT), such as a plasma treatment using a halogen element (e.g., $NF_3$ etc.), etc.

Figure 14A:
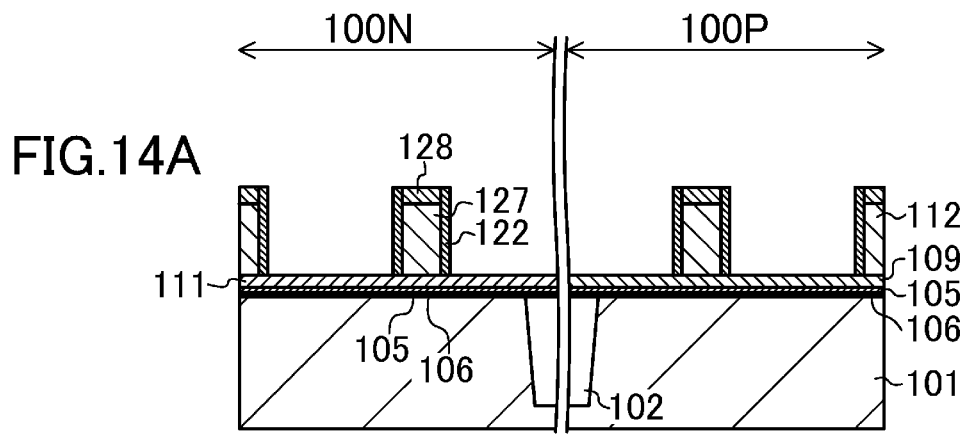
FIGS. 14A-14D are cross-sectional views showing successive steps in the method for fabricating the semiconductor device of the third embodiment of the present disclosure.

Next, as shown in FIG. 14A, an etch-back process is performed on the TiN film which forms the gate sidewall metal layer 122, to remove the TiN film from the top surface of the gate electrode material 128 and the top surfaces of the pMIS metal material 109 and the nMIS metal material 111 while leaving the TiN film only on gate sidewall portions. As a result, bottom portions of the gate sidewall metal layer 122 are connected to the top surfaces of the pMIS metal material 109 and the nMIS metal material 111. Sidewalls of the gate sidewall metal layer 122 are connected to sidewalls of the gate electrode material 112. If the gate electrode material 107 and the gate sidewall metal layer 122 are comprised of the same material, the top surfaces of the pMIS metal material 109 and the nMIS metal material 111 are likely to be slightly etched and removed during the etch-back process, and therefore, the overetch amounts of the pMIS metal material 109 and the nMIS metal material 111 may be reduced by end point detection etc. so that the etch does not reach the gate insulating film 105.

Figure 14B:
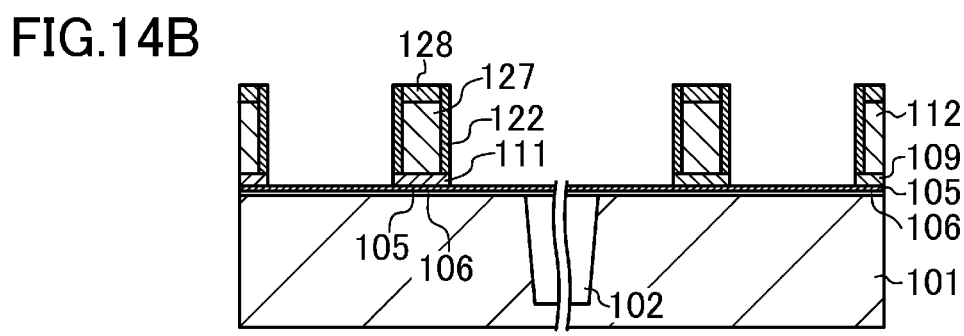

Next, as shown in FIG. 14B, the pMIS metal material 109 and the nMIS metal material 111 are removed by anisotropic etching until the gate insulating film 105 is exposed. Next, after the removal of the pMIS metal material 109 and the nMIS metal material 111, the exposed gate insulating film 105, and the interface layer 106 located therebelow, are removed by wet etching etc.

Figure 14C:
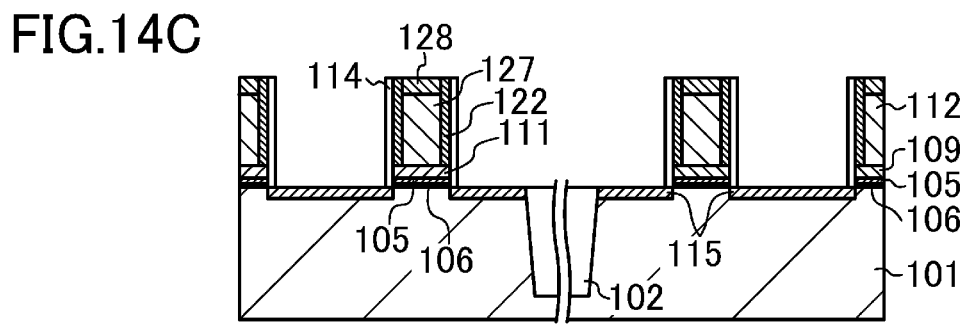

Next, as shown in FIG. 14C, an insulating film (e.g., a TEOS film or a SiN film, etc.) having a thickness of about 5-20 nm is deposited on an entire surface of the semiconductor substrate 101 by low-pressure chemical vapor deposition (LPCVD). An etch-back process is performed by anisotropic dry etching to form offset sidewalls 114 on sidewalls of the gate sidewall metal layer 122, the pMIS metal material 109 or the nMIS metal material 111, the gate insulating film 105, and the interface layer 106. Next, an extension implantation layer 115 is formed in the regions 100N and 100P by implanting respective desired ions thereinto.

Figure 14D:
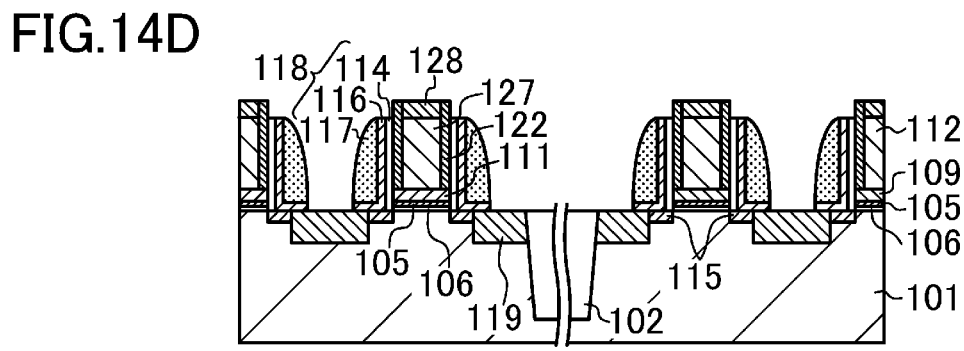

Next, as shown in FIG. 14D, an oxide film (e.g., a TEOS film formed by LPCVD or an NSG film formed by sub-atmospheric chemical vapor deposition (SACVD), etc.) having a thickness of about 5-20 nm is deposited as a lower sidewall film 116 on an entire surface of the semiconductor substrate 101. Thereafter, an insulating film (e.g., an atomic layer deposition-SiN (ALD-SiN) film etc.) having a thickness of, for example, about 20-40 nm is deposited as an upper sidewall film 117. Next, an etch-back process is performed by anisotropic dry etching on the multilayer film of the lower sidewall film 116 and the upper sidewall film 117 to form sidewalls 118 including the offset sidewall 114, the lower sidewall film 116, and the upper sidewall film 117. Next, arsenic (As) ions are implanted into the region 100N at a dose of about $1-5\times10^{15}$ atoms/cm$^2$ with an implantation energy of about 10-25 keV, or phosphorus (P) ions are implanted into the region 100N at a dose of about $1-5\times10^{15}$ atoms/cm$^2$ with an implantation energy of about 5-15 keV. Boron (B) ions are implanted into the region 100P at a dose of about $1-5\times10^{15}$ atoms/cm$^2$ with an implantation energy of about 1-3 keV. As a result, a source/drain implantation layer 119 is formed. Next, the impurities introduced by the ion implantation are activated by an activation thermal treatment. Note that, during this ion implantation, the ions are also simultaneously implanted into the gate electrode surfaces (a surface of the gate electrode material 128) (not shown). Next, the impurities introduced by the ion implantation are activated by performing an activation thermal treatment at high temperature (1000° C. or more) for a short time by lamp heating or laser heating.

Figure 15:
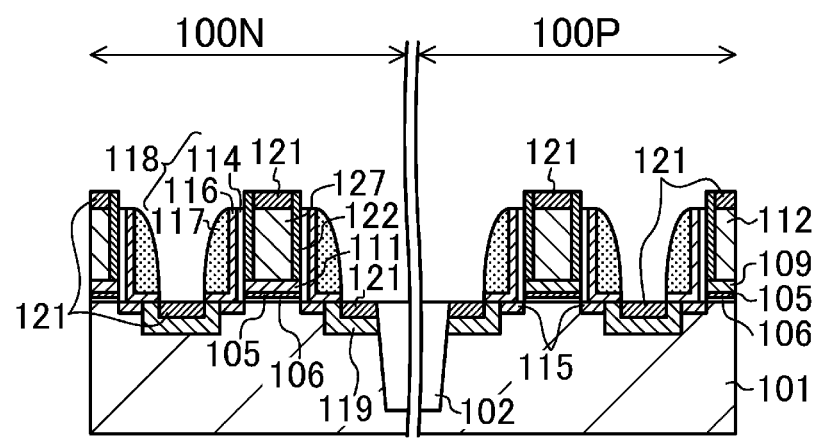
FIG. 15 is a cross-sectional view showing successive steps in the method for fabricating the semiconductor device of the third embodiment of the present disclosure.

Next, as shown in FIG. 15, a film of Ni, which is a high melting point metal, having a thickness of about 5-20 nm is deposited by sputtering on an entire surface of the semiconductor substrate 101, and a thermal treatment for silicidation is then performed. Next, an unreacted region after the silicidation is removed by wet etching, and a thermal treatment is then appropriately performed. As a result, a Ni silicide layer 121 is formed in each of a surface of the source/drain implantation layer 119 in the surface of the semiconductor substrate 101 and a surface of the gate electrode material 128. Note that when the unreacted region after the silicidation is removed by wet etching, the etch amount of the gate sidewall metal layer 122 is reduced by using a chemical solution having an etch selectivity ratio with respect to the Ni film (high melting point metal) and the gate sidewall metal layer 122. For example, when the high melting point material is formed of a Ni film and the gate sidewall metal layer 122 is formed of a TiN film, an acid solution such as hydrochloric acid etc. can be used.

Thus, the sidewall of the gate sidewall metal layer 122 is connected to the sidewall of the silicide layer 121 on the gate electrode. In the region 100P, the pMIS metal material (metal electrode layer) 109 provided on the top surface of the gate insulating film 105 and the silicide layer (electrode layer) 121 provided on the top surface of the gate electrode are physically coupled together by the gate sidewall metal layer (metal layer) 122. In the region 100N, the nMIS metal material (metal electrode layer) 111 provided on the top surface of the gate insulating film 105 and the silicide layer (electrode layer) 121 provided on the top surface of the gate electrode are physically coupled together by the gate sidewall metal layer (metal layer) 122. Therefore, even if a multilayer structure including an interface between the metal layer and the silicon layer is present in the metal gate electrode, a connection resistance to the metal layer on the gate insulating film can be reduced irrespective of the resistance value, implantation distribution, or material of the silicon layer in the gate electrode. As a result, a high-performance device can be obtained in which a degradation in characteristics, such as a transistor delay during high-speed operation or variations in transistor characteristics, etc., is not likely to occur, and which has a low-cost structure.

—Variation (3) of First Embodiment and its Variation and Third Embodiment—

Figure 17A:
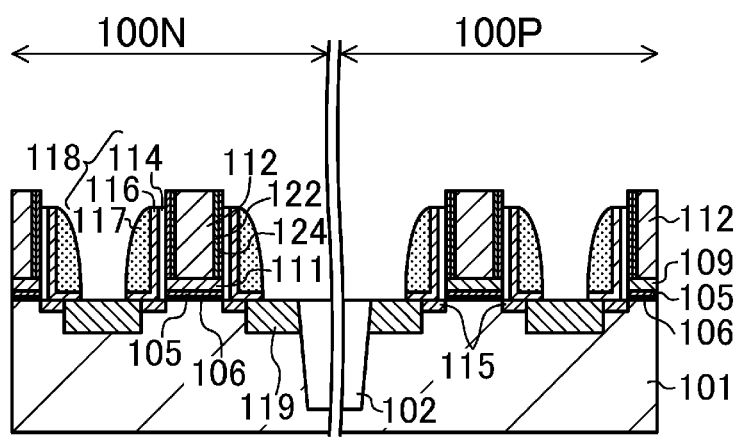
FIGS. 17A and 17B are cross-sectional views showing successive steps in the method for fabricating the semiconductor device of the variation (3) of the first embodiment and its variation (1) and the third embodiment of the present disclosure.
Figure 17B:
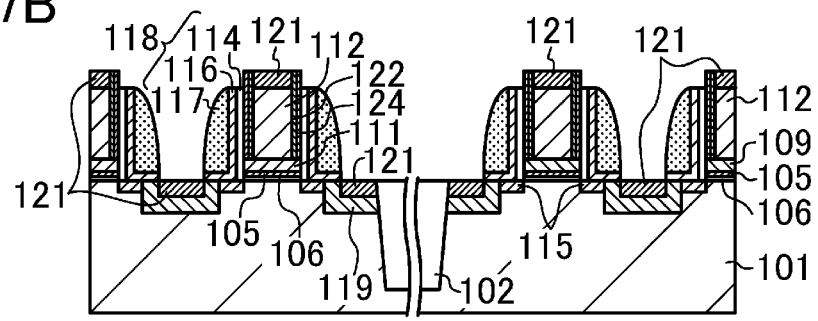

A semiconductor device according to a variation (3) has a configuration shown in FIG. 17B. Specifically, the gate sidewall metal layer 122 in the semiconductor device of the first embodiment and its variation (1) and the third embodiment shown in FIGS. 3D, 7A, and 15, respectively, is adapted to have a multilayer structure including an inner gate sidewall metal layer 122 (inner conductive film) and an outer gate sidewall metal layer 124 (outer conductive film), which are successively formed with the layer 122 being located further inside than the layer 124.

FIGS. 16A-16D and 17A and 17B are cross-sectional views showing successive steps in a method for fabricating the semiconductor device of the variation (3), where the variation (3) is applied to the method for fabricating the semiconductor device of the first embodiment.

Figure 16A:
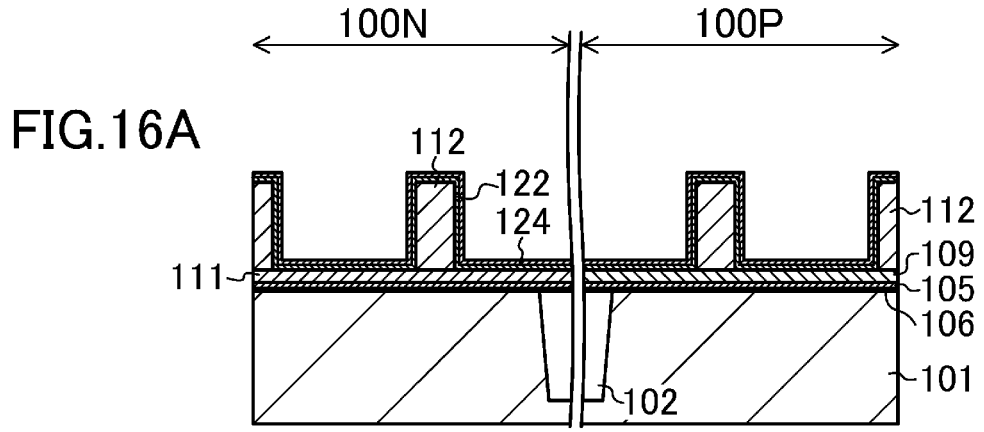
FIGS. 16A-16D are cross-sectional views showing successive steps in a method for fabricating a semiconductor device according to a variation (3) of the first embodiment and its variation (1) and the third embodiment of the present disclosure.
Figure 16B:
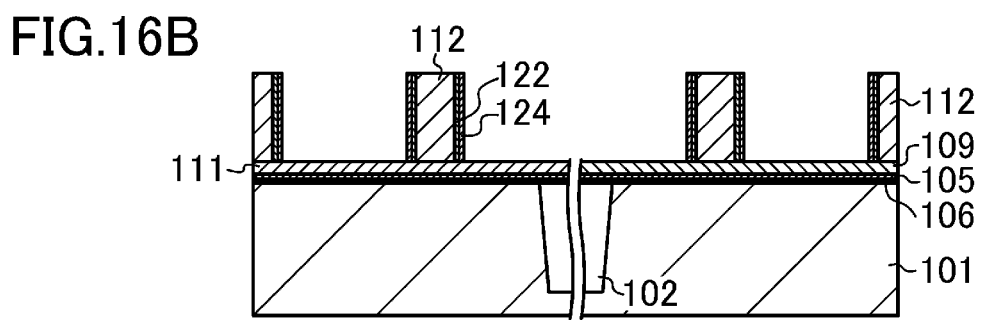
Figure 16C:
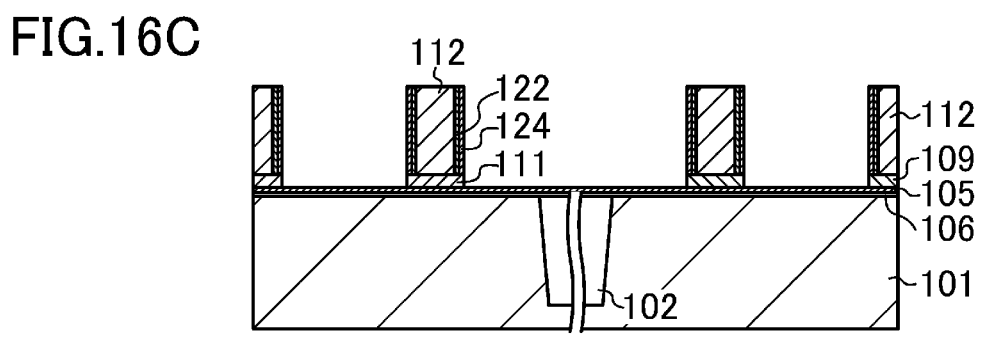
Figure 16D:
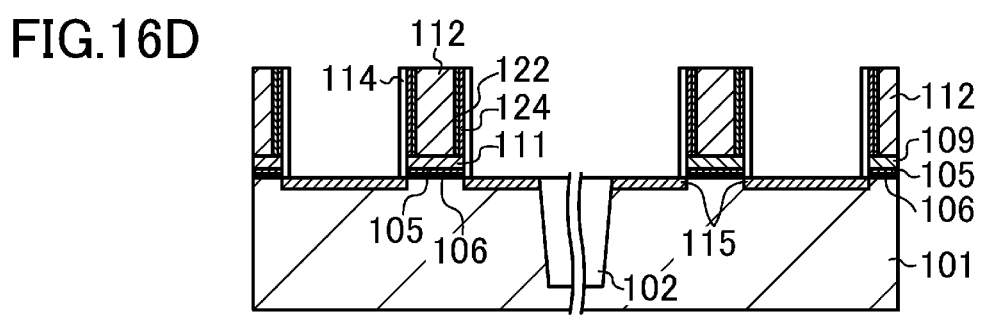

Initially, the steps of FIGS. 1A-2A are performed. Thereafter, as shown in FIG. 16A, the inner gate sidewall metal layer 122 and the outer gate sidewall metal layer 124 are successively formed on an entire surface of the semiconductor substrate 101 to cover the gate electrode material 112. Note that subsequent steps are as shown in FIGS. 16B-16D, 17A, and 17B, and specifically, are similar to those of FIGS. 2D-3D.

Thus, if the multilayer structure is provided in which a low-resistance film (e.g., a Ta film etc.) is selected as the inner gate sidewall metal layer 122, and an oxidation prevention film (e.g., a TiN film etc.) is selected as the outer gate sidewall metal layer 124, the connection between the metal layer on the top surface of the gate electrode and the metal layer on the bottom surface of the gate electrode can have a lower resistance and can be stabilized.

While, here, an example in which the variation (3) is applied to the first embodiment has been described, the variation (3) can also be applied to the variation (1) of the first embodiment and the third embodiment. Specifically, when the variation (3) is applied to the variation (1) of the first embodiment, the metal layer having the multilayer structure may be formed in FIG. 5D, and thereafter, the steps of FIGS. 6A-7A may be similarly performed. When the variation (3) is applied to the third embodiment, the metal layer having the multilayer structure may be formed in FIG. 13D, and thereafter, the steps of FIGS. 14A-20 may be similarly performed.

—Variation (4) of Second Embodiment and its Variation—

Figure 19A:
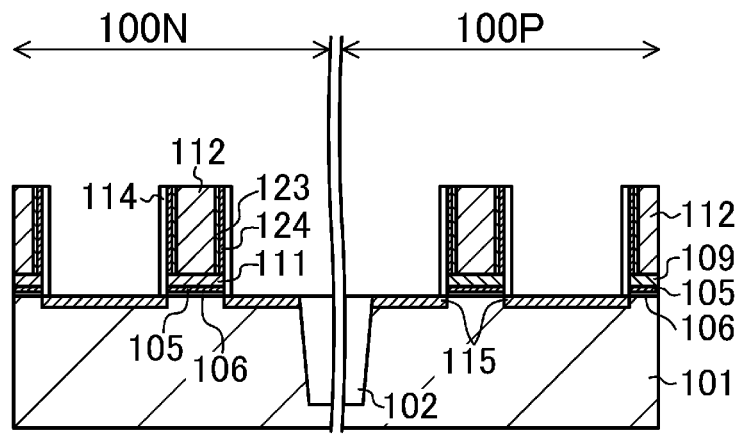
FIGS. 19A-19C are cross-sectional views showing successive steps in the method for fabricating the semiconductor device of the variation (4) of the second embodiment and its variation (2) of the present disclosure.
Figure 19B:
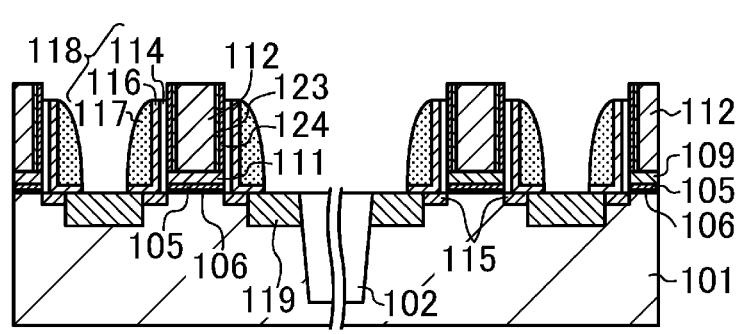
Figure 19C:
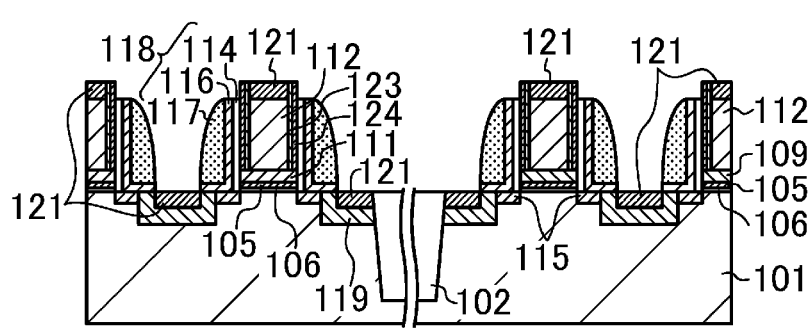

A semiconductor device according to a variation (4) has a configuration shown in FIG. 19C. Specifically, the gate sidewall silicide layer 123 in the semiconductor device of the second embodiment and its variation (2) shown in FIGS. 9D and 12B, respectively, is adapted to have a structure including an inner gate sidewall silicide layer 123 (inner conductive film) and an outer gate sidewall metal layer 124 (outer conductive film), which are successively formed with the layer 123 being located further inside than the layer 124.

FIGS. 18A-18D and 19A-19C are cross-sectional views showing successive steps in a method for fabricating the semiconductor device of the variation (4), where the variation (4) is applied to the method for fabricating the semiconductor device of the second embodiment.

Figure 18A:
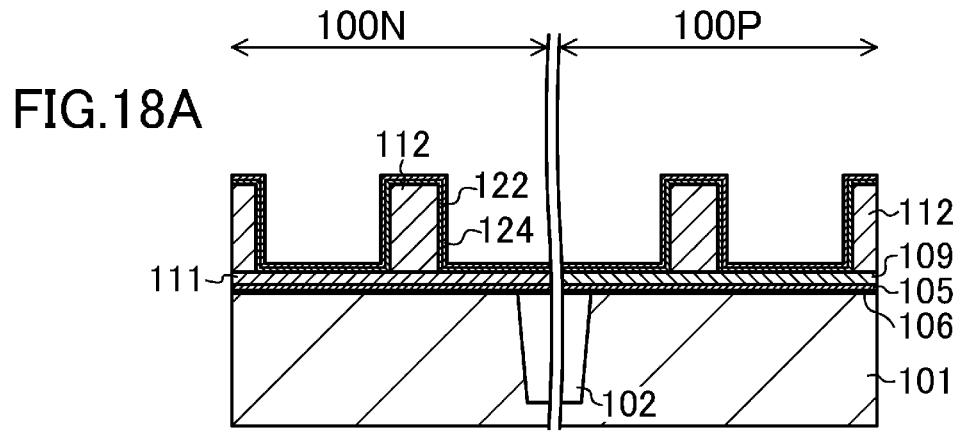
FIGS. 18A-18D are cross-sectional views showing successive steps in a method for fabricating a semiconductor device according to a variation (4) of the second embodiment and its variation (2) of the present disclosure.
Figure 18B:
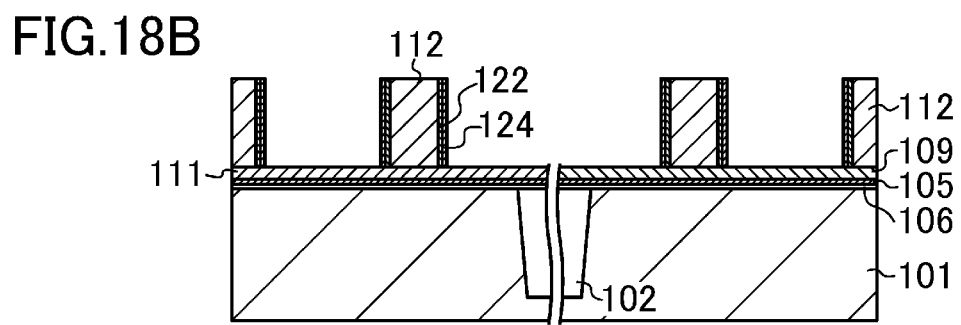
Figure 18C:
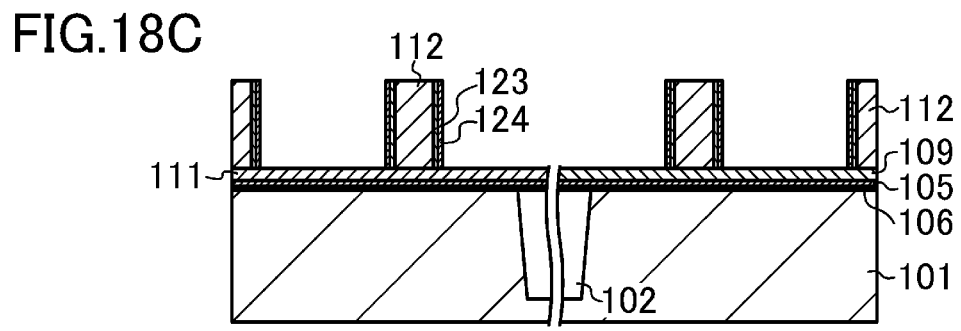
Figure 18D:
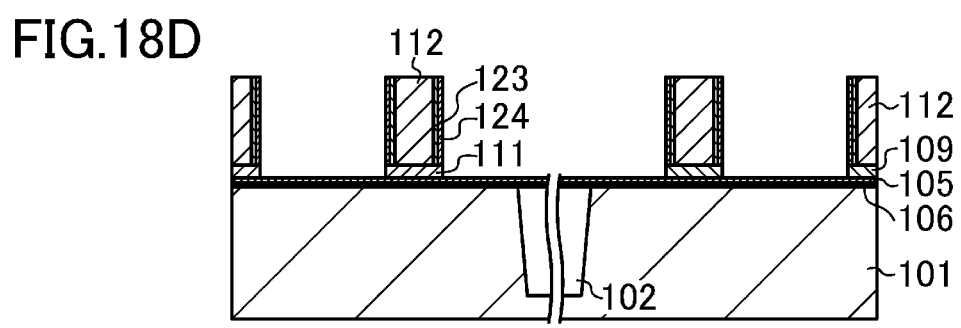

Initially, the steps of FIGS. 1A-2A and the step of FIG. 8A are performed. Thereafter, as shown in FIG. 18A, an inner gate sidewall metal layer 122 and the outer gate sidewall metal layer 124 are successively formed on an entire surface of the semiconductor substrate 101 to cover the gate electrode material 112. Next, a step shown in FIG. 18B is performed in a manner similar to that of the step of FIG. 8C. Thereafter, as shown in FIG. 18C, the inner gate sidewall metal layer 122 is transformed into silicide to form the inner gate sidewall silicide layer 123. Note that subsequent steps are as shown in FIGS. 18D-19C and, specifically, are similar to those of FIGS. 8D-9D.

Thus, if the multilayer structure is provided in which, for example, a Ni film is selected as the inner gate sidewall metal layer, a low-resistance film (e.g., a Ni silicide layer etc.) is selected as the inner gate sidewall silicide layer 123, and an oxidation prevention film (e.g., a TiN film etc.) is selected as the outer gate sidewall metal layer 124, the connection between the metal layer on the top surface of the gate electrode and the metal layer on the bottom surface of the gate electrode can have a lower resistance and can be stabilized.

While, here, an example in which the variation (4) is applied to the second embodiment has been described, the variation (4) can also be applied to the variation (2) of the second embodiment. Specifically, when the variation (4) is applied to the variation (2) of the second embodiment, the metal layer having the multilayer structure may be formed in FIG. 10D, and thereafter, the steps of FIGS. 11A-12B may be similarly performed.

Note that, in the first to third embodiments and the variations (1)-(4), a structure may be provided in which the upper sidewall film (sidewall film) 117 is removed and a contact liner film 129 is provided as a stressor film for applying or reducing stress. In this case, stress can be applied or reduced to the channel of the transistor gate, whereby the drive current of the transistor is improved.

Figure 20:
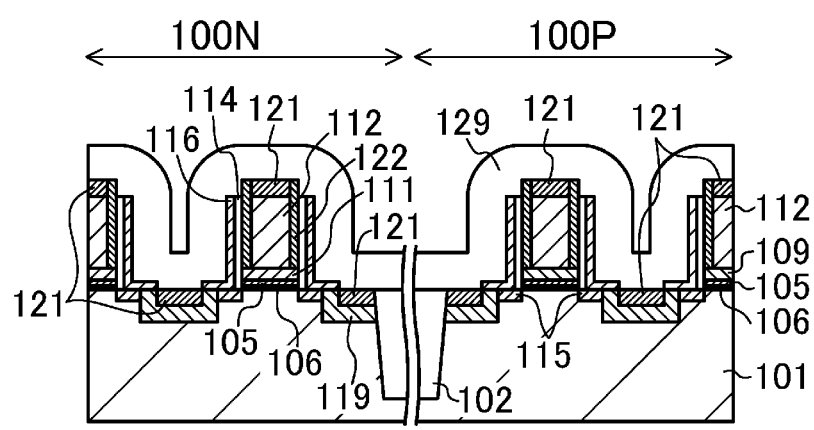
FIG. 20 is a cross-sectional view showing a structure of a semiconductor device according to another embodiment of the present disclosure.

For example, FIG. 20 is a cross-sectional view showing an example in which this structure is applied to the first embodiment. The contact liner film 129 may be formed of, for example, a silicon nitride film. With this structure, in addition to the reduction in the resistance inside the gate electrode which is a characteristic feature of the first embodiment, stress can be applied to the channel surface of the gate electrode of the transistor, whereby the drive capability of the transistor is improved. Therefore, a device structure capable of high-speed operation is particularly obtained. Note that even when this structure is applied to the other embodiments and variations, similar advantages can, of course, be obtained. As the contact liner film 129, a silicon nitride film may be used which applies or releases stress to the channel surface of the gate electrode of the transistor.

Note that, in the first to third embodiments and the variations (1)-(4), a structure may be provided in which a portion of the activated source/drain implantation layer 119 is used as a stress application layer 130. In this case, stress can be applied to the channel of the transistor gate, whereby the drive current of the transistor is improved.

Figure 21:
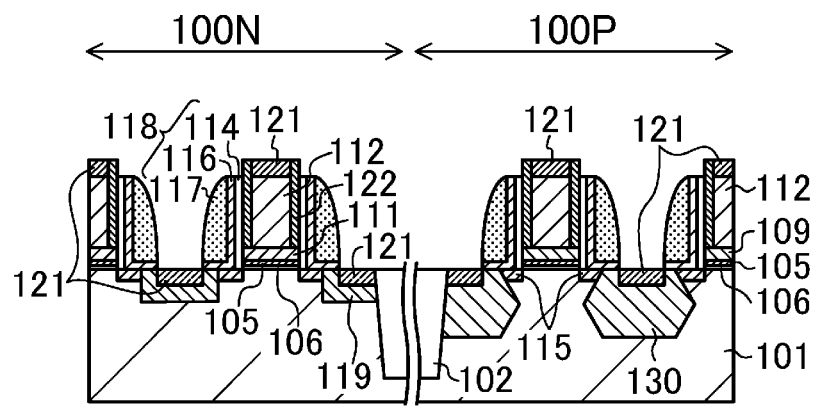
FIG. 21 is a cross-sectional view showing a structure of a semiconductor device according to another embodiment of the present disclosure.

For example, FIG. 21 is a cross-sectional view showing an example in which this structure is applied to the first embodiment. In the example of FIG. 21, the stress application layer 130 is formed in an n-well region of the region 100P, and may be formed of, for example, SiGe. Although not shown, when the stress application layer 130 is formed in a p-well region of the region 100N, the stress application layer 130 may be formed of, for example, SiC. With this structure, in addition to the reduction in the resistance inside the gate electrode which is a characteristic feature of the first embodiment, stress can be applied to the channel, whereby the drive capability of the transistor is improved. Therefore, a device structure capable of high-speed operation is particularly provided. Note that even when this structure is applied to the other embodiments and variations, similar advantages can, of course, be obtained.

Note that, in the first to third embodiments and the variations (1)-(4), as the interface layer 106, a SiON film which is obtained by nitriding a silicon oxide film, a silicon oxide film which is obtained by oxidizing the semiconductor substrate 101, or a multilayer film of SiON and ALD-SiN, may be used instead of the silicon oxide film which is obtained by oxidizing the semiconductor substrate 101.

The material or thickness of the gate insulating film 105 is not limited to the above examples. Specifically, the gate insulating film may be a single-layer film including any one selected from the group consisting of a high-k film (e.g., a $HfO_2$ film, a $HfSi_xO_y$ film, or a $HfAl_xO_y$ film, etc.), a SiO2 film, and those doped with nitrogen, or a multilayer film including at least one film selected from that group. The thickness of the gate insulating film 105 may be appropriately determined based on the gate length, the allowable value of the EOT, and the allowable value of the leakage current, etc.

Note that, in the first to third embodiments and the variations (1)-(4), the step of removing the gate insulating film 105 and the interface layer 106 is performed after the step of removing the pMIS metal material 109 and the nMIS metal material 111. Alternatively, the gate insulating film 105 and the interface layer 106 may be etched simultaneously with an etch-back process (described below) of the offset sidewall 114. In this case, although not shown, the gate insulating film 105, and the interface layer 106 located therebelow, are provided below and continuous with the pMIS metal material 109, the nMIS metal material 111, and the offset sidewall 114.

Note that, in the first to third embodiments and the variations (1)-(4), the pMIS metal material 109 and the nMIS metal material 111 are formed by implanting carbon or fluorine ions into the single gate electrode material 107. Alternatively, the pMIS metal material 109 and the nMIS metal material 111 may be formed by etching respective separate metal materials. Other elements, such as nitrogen or oxygen, etc., may be implanted, and may be appropriately selected based on the work function. Nitrogen is mostly effective to the formation of an nMIS transistor and oxygen is mostly effective to the formation of a pMIS transistor, although this depends on the implantation concentration and metal species.

Note that, in the first to third embodiments and the variations (1)-(4), when the pMIS metal material 109 and the nMIS metal material 111 are formed by etching respective separate metal materials, a material whose work function is close to that of $n^+$ PolySi may be selected as the nMIS metal material 111 in order to reduce the threshold voltage of the transistor in the region 100N. For example, such a material may be a metal film comprised of at least one metal selected from the group consisting of Ti, Zr, Hf, V, Nb, Ta, Cr, Mo, and W. Alternatively, such a material may be a film comprised of a nitride, silicide, carbide, oxide, or other compounds of at least one metal selected from that metal group if the material has a work function close to that of $n^+$ PolySi and has conductivity. Note that a nitride of Ti, Ta, Zr, Hf, or Nb is preferably used as the nMIS metal material 111 if the nitride does not have a stoichiometric composition and contains a smaller amount of N.

The pMIS metal material 109 may be a material whose work function is close to $n^+$ PolySi in order to reduce the threshold voltage of the transistor in the p-channel region 104. For example, such a film may be a metal film comprised of at least one metal selected from the group consisting of Ni, Pd, Pt, Co, Rh, Ru, Cu, Ag, Au, and Al. Alternatively, such a film may be one that is comprised of a nitride, silicide, carbide, oxide, or other compounds of at least one metal selected from that metal group if the film has a work function close to that of $n^+$ PolySi and has conductivity. Such a film may be one that is comprised of a nitride of Ti, Ta, Zr, Hf, or Nb having a stoichiometric composition of TiN, TaN, ZrN, HfN, or NbN, one that is comprised of Ru oxide, or one that is comprised of Ir oxide. The pMIS metal material 109 and the nMIS metal material 111 may be formed by LPCVD, sputtering, or atomic layer deposition (ALD), etc.

Figure 22:
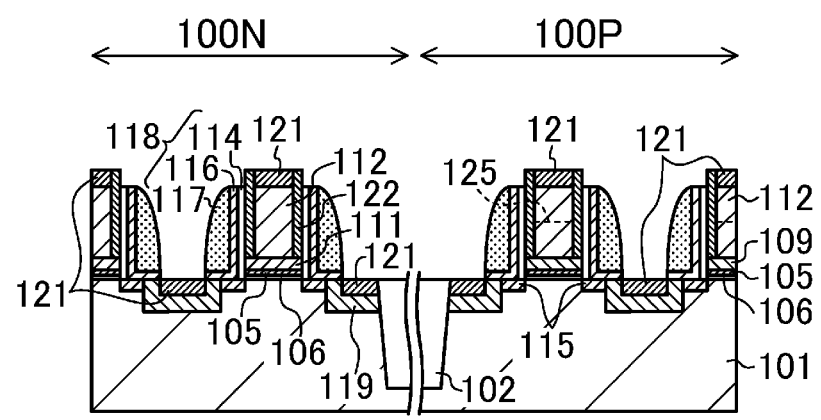
FIG. 22 is a cross-sectional view showing a structure of a semiconductor device according to another embodiment of the present disclosure.
Figure 23A:
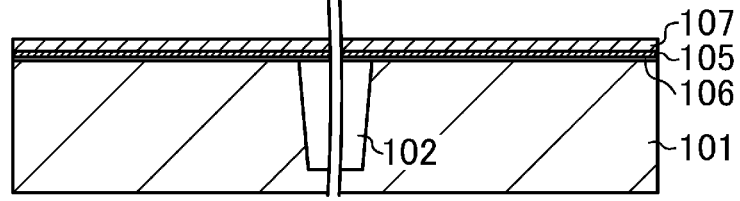
FIGS. 23A-23D are cross-sectional views showing successive steps in a method for fabricating a conventional semiconductor device.
Figure 23B:
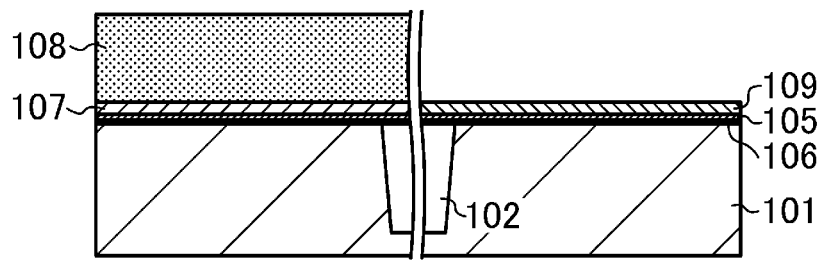
Figure 23C:
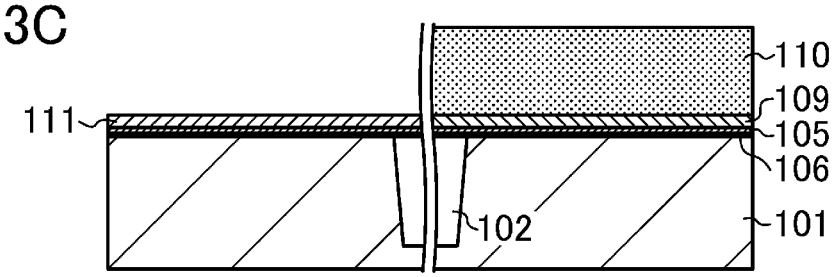
Figure 23D:
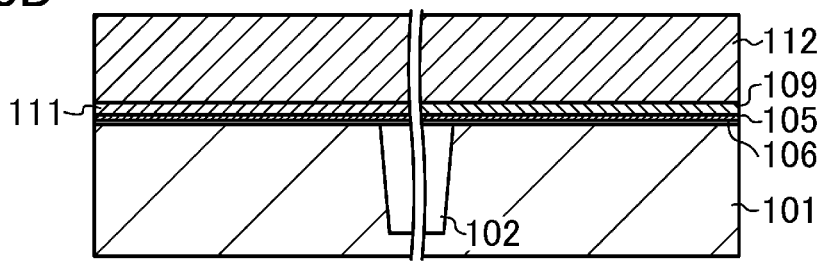
Figure 24A:
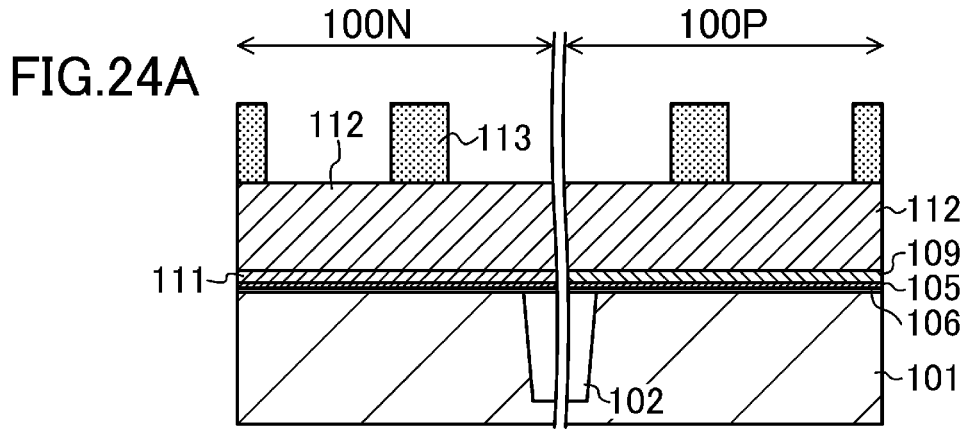
FIGS. 24A-24D are cross-sectional views showing successive steps in the method for fabricating the conventional semiconductor device.
Figure 24B:
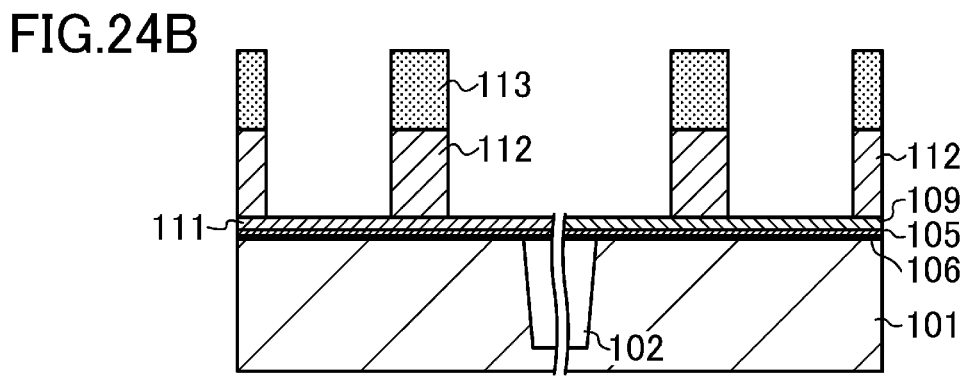
Figure 24C:
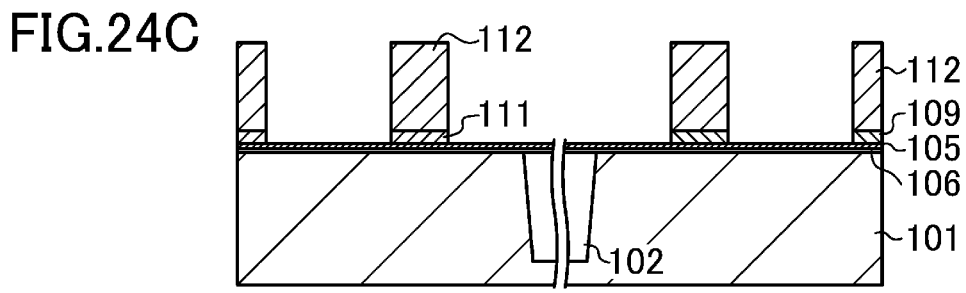
Figure 24D:
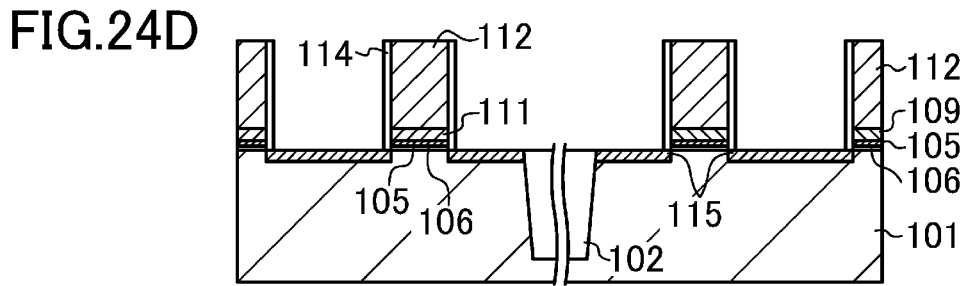
Figure 25A:
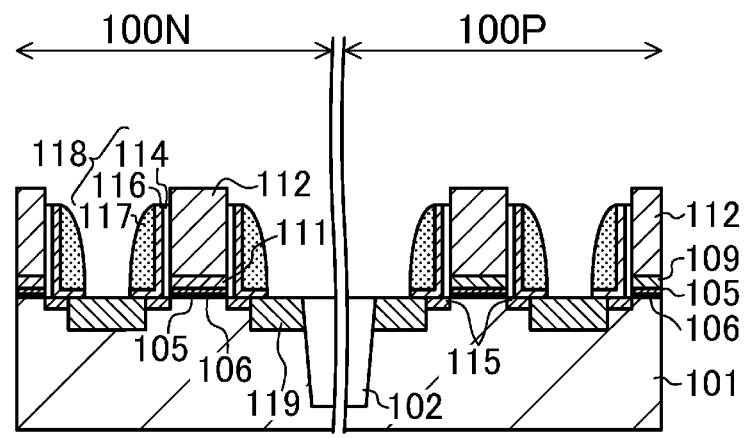
FIGS. 25A and 25B are cross-sectional views showing successive steps in the method for fabricating the conventional semiconductor device.
Figure 25B:
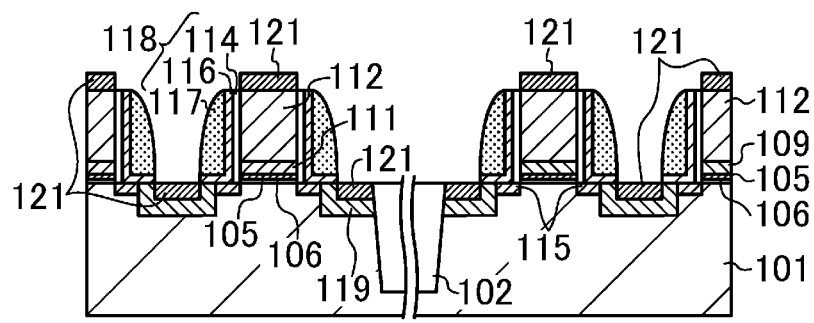

Note that, in the first to third embodiments and the variations (1)-(4), the gate electrode material 112 and the gate electrode material 128 may be polysilicon doped with phosphorus (P) instead of undoped polysilicon. In this case, boron (B), which is a P-type impurity, is implanted into the gate electrode in the region 100P by performing source/drain implantation into the polysilicon doped with phosphorus (P), which is an N-type impurity. Therefore, as shown in FIG. 22, an in-gate horizontal PN junction 125 is formed in a plane parallel to the main surface of the semiconductor substrate 101. The in-gate horizontal PN junction 125 typically has a high resistance and is therefore likely to cause a gate signal delay. In the above embodiments and variations, the gate sidewall metal layer 122 is formed, and therefore, even if the in-gate horizontal PN junction 125 is present, the nMIS metal material 111 and the pMIS metal material 109 which are metal electrode layers provided on the top surface of the gate insulating film 105, and the silicide layer 121 which is an electrode layer provided on the top surface of the gate electrode, are physically coupled together by the gate sidewall metal layer (metal layer) 122. Therefore, even if a PN junction is present in the metal gate electrode between the metal layer provided on the top surface of the gate electrode and the metal layer provided on the bottom surface of the gate electrode, the connection resistance to the metal on the gate insulating film can be reduced irrespective of the implantation distribution or material of the gate electrode. As a result, a high-performance device can be obtained in which a degradation in characteristics, such as a transistor delay during high-speed operation or variations in transistor characteristics, etc., is not likely to occur, and which has a low-cost structure.

Conventionally, when the gate electrode material 112 is undoped polysilicon, or polysilicon previously doped with a dopant, the source/drain implantation depth needs to be increased in order to form an undoped layer which is a high resistance layer of the gate electrode material 112, or the in-gate horizontal PN junction 125, in the gate. Therefore, conventionally, a degradation in characteristics of the transistor due to the short channel effect is unavoidable. In the above embodiments and variations, the source/drain implantation depth can be set independently of the formation of the undoped layer of the gate electrode material 112 or the in-gate horizontal PN junction 125. Therefore, high-speed operation of the transistor can be achieved without a degradation in characteristics of the transistor.

Therefore, any silicon material can be selected as a material for the gate electrode material 112. An electrode material may be used which contains amorphous Si, or Si doped with phosphorus (P), arsenic (As), boron (B), indium (In), carbon (C), fluorine (F), nitrogen (N), oxygen (O), germanium (Ge), platinum (Pt), nickel (Ni), cobalt (Co), titanium (Ti), iron (Fe), tungsten (W), or molybdenum (Mo), which is obtained by performing ion implantation, thermal diffusion, and reaction with silicon on undoped polysilicon. Alternatively, an electrode material containing Si doped with germanium (Ge) (i.e., SiGe) may be used. The electrode material may be appropriately determined based on workability or reaction with silicide, etc. The electrode material may be formed by a film formation technique (e.g., LPCVD, sputtering, or ALD, etc.) or an application technique using a coating silicon material. A silicon material doped with carbon or a metal, or porous silicon, etc., may be selected.

Note that, in the third embodiment, as the gate electrode material 127, an insulating film, such as a silicon nitride film or a silicon oxynitride film, etc. may be selected instead of the silicon oxide film, taking into consideration the ease of processing the gate electrode. A stress film may also be introduced into the gate electrode. The stress film may be selected from a silicon nitride film, a silicon carbide film, a porous silicon film, a silicide film, a SiC film, etc. In addition, the insulating film which forms the gate electrode material 127 may be an yttrium oxide film, an aluminum oxide film, or an aluminum nitride film.

The gate electrode material 127 may be a conductive film configured to transmit light, such as an Ir oxide film or a Ru oxide film, etc. instead of the polysilicon film, which does not transmit light. As described above, instead of the silicon oxide film (insulating film), a silicon nitride film, a silicon oxynitride film, an iridium oxide film, or a ruthenium oxide film may be selected. Therefore, the third embodiment is particularly useful for applications, such as a device which converts light into electricity, etc. The entire perimeter of the gate electrode material 127 is covered by a metal film which does not transmit light. Therefore, if an opening is formed in the metal film to pass light to a portion of the gate electrode, a structure which can be used as an optical waveguide may be provided.

Thus, a silicon oxide film, a silicon nitride film, a silicon oxynitride film, a yttrium oxide film, an aluminum oxide film, or an aluminum nitride film may be used as the insulating film material which is the gate electrode material 127.

Note that, in the variation (2) of the second embodiment, the gate hard mask 126 may be selected from insulating films, such as a silicon nitride film, a silicon oxynitride film, etc., instead of the silicon oxide film, taking into consideration the ease of processing the gate electrode. The gate hard mask 126 can be appropriately applied not only to the variation (2) of second embodiment, but also to the first and third embodiments.

Note that, in the first embodiment and its variation (1) and the third embodiment, the gate sidewall metal layer 122 may be comprised of the same material for the nMIS metal material 111 and the pMIS metal material 109, which is a material with which conductivity can be ensured. The gate sidewall metal layer 122 can be formed by a method similar to that which is used to form the nMIS metal material 111 and the pMIS metal material 109, i.e., a method with which the gate sidewall metal layer 122 can be easily formed on the gate sidewall, i.e., LPCVD, ALD, etc.

Note that, in FIGS. 17B and 19C of the variations (3) and (4), the gate sidewall metal layer 124 may be comprised of a material with which oxidation resistance can be ensured, such as a metal film of TiN, TaN, Pt, Ag, or Au, etc. The gate sidewall metal layer 124 may also be formed of a film comprised of an oxide or other compounds. The metal oxide may be Ru oxide or Ir oxide, etc. In this case, the gate sidewall silicide layer 123 may be a low-resistance film containing at least one selected from the group consisting of Ni, Co, Ti, W, Pt, and Mo.

Although, in the second embodiment and its variation (2), an example in which the gate sidewall silicide layer 123 is comprised of Ni silicide has been described, the gate sidewall silicide layer 123 may be comprised of a silicide of Co, Ti, W, Pt, Mo, or a metal alloy or multilayer metal thereof. This does not cause a particular problem.

Note that, in the first to third embodiments and the variations (1)-(4), an example in which the offset sidewall 114 is formed of an insulating film, such as a TEOS film or a SiN film, etc., has been described, the offset sidewall 114 may be formed of NSG, which can be formed into a film at low temperature by SACVD, low-temperature LP-TEOS, low-temperature ALD-SiN film, or low-temperature SiC or SiON, etc., in order to reduce, for example, oxidation of the gate electrode or the semiconductor substrate 101. In particular, if a film which does not contain oxygen is used, the oxidation of the gate electrode or the semiconductor substrate 101 is effectively reduced.

Note that, in the first to third embodiments and the variations (1)-(4), an example in which the silicide layer 121 is comprised of Ni silicide has been described, the silicide layer 121 may be comprised of a silicide of Co, Ti, W, Pt, Mo, or a metal alloy or multilayer metal thereof. This does not cause a particular problem. In this case, the silicide layer 121 may be comprised of the same material for the gate sidewall silicide layer 123.

Note that, in the first embodiment and its variation (1) and the third embodiment, an example combination in which the high melting point metal material for the silicide layer 121 is comprised of Ni and the gate sidewall metal layer 122 is comprised of TiN has been described. Even if other combinations are used, then when an unreacted region after silicidation is removed by wet etching, the etch amount of the gate sidewall metal layer 122 is reduced by using a chemical solution having an etch selectivity ratio with respect to the high melting point metal material and the gate sidewall silicide layer 123. For example, in the case of a combination in which the high melting point metal material is comprised of Co, Ti, or W, etc. and the gate sidewall silicide layer 123 is formed of a TiN film, an acid solution such as hydrochloric acid etc. may be used.

As described above, the present disclosure is useful for semiconductor devices including a logic element of a CMOS device in which an n-channel transistor and a p-channel transistor are provided on the same chip, or a memory element (e.g., an SRAM device etc.).

What is claimed is:

1. A semiconductor device including a transistor formed on a semiconductor substrate, comprising:
   a gate insulating film formed on the semiconductor substrate;
   a first conductive film being a metal film, a metal nitride film, a metal silicide film or a metal carbide film, and formed on and in contact with the gate insulating film;
   a middle layer formed on an upper surface of the first conductive film and in contact with the first conductive film and containing a silicon material, the middle layer being separated from the gate insulating film by the first conductive film;
   a second conductive film, comprising of different aterial from the middle layer, formed on an upper surface of the first conductive film and in contact with the first conductive film and in contact with a sidewall of the middle layer, and
   the first conductive film has a different chemical composition from the second conductive film.

2. The semiconductor device of claim 1, further comprising:
   a third conductive film formed on and in contact with the middle layer,
   wherein the second conductive film is also formed in contact with a sidewall of the third conductive film.

3. The semiconductor device of claim 2, wherein the third conductive film is comprised of a silicide material or a metal material.

4. The semiconductor device of claim 3, wherein when the third conductive film is comprised of the silicide material, the third conductive film contains at least one selected from the group consisting of Ni, Co, Ti, W, Pt, and Mo.

5. The semiconductor device of claim 1, wherein the middle layer is comprised of a material containing silicon as a major component, the material being polysilicon, amorphous silicon, or porous silicon.

6. The semiconductor device of claim 5, wherein
   the material containing silicon as a major component is an undoped silicon film or a silicon film doped with an atom other than silicon, and
   the doped silicon film is a film comprised of a material doped with at least one selected from phosphorus (P), arsenic (As), boron (B), indium (In), carbon (C), fluorine (F), nitrogen (N), oxygen (O), germanium (Ge), platinum (Pt), nickel (Ni), cobalt (Co), titanium (Ti), iron (Fe), tungsten (W), and molybdenum (Mo).

7. The semiconductor device of claim 5, wherein the middle layer contains a P-type carrier and an N-type carrier in the material containing silicon as a major component so that the middle layer has a PN junction in a plane perpendicular to a main surface of the semiconductor substrate.

8. The semiconductor device of claim 5, wherein the middle layer contains a P-type carrier and an N-type carrier in the material containing silicon as a major component so that the middle layer has a PN junction in a plane parallel to a main surface of the semiconductor substrate.

9. The semiconductor device of claim I wherein the middle layer is comprised of an insulating film material which is silicon oxide, silicon nitride, or silicon oxynitride.

10. The semiconductor device of claim 1, wherein
    the middle layer is formed of a multilayer film including a material containing silicon as a major component and an insulating film material,
    the material containing silicon as a major component is polysilicon, amorphous silicon, or porous silicon, and
    the insulating film material includes silicon oxide, silicon nitride, silicon oxynitride, yttrium oxide, aluminum oxide, and aluminum nitride.

11. The semiconductor device of claim 1, wherein the middle layer is a film configured to apply or release stress to a channel surface of a gate electrode included in the transistor, and is formed of a film of silicon nitride, porous silicon, silicide, SiGe, or SiC.

12. The semiconductor device of claim 1, wherein the middle layer is a film configured to transmit light, and is formed of a film of silicon oxide, silicon nitride, or silicon oxynitride.

13. The semiconductor device of claim 1, wherein the first conductive film is a film configured to set a threshold of a gate electrode included in the transistor, the film being a metal film comprised of at least one metal selected from the group consisting of Ti, Zr, Hf, V, Nb, Ta, Cr, Mo, and W, or a film comprised of a nitride, silicide, or carbide of at least one metal selected from the metal group, where the nitride of Ti, Ta, Zr, Hf, or Nb does not have a stoichiometric composition and contains a smaller amount of N.

14. The semiconductor device of claim 1, wherein the first conductive film is a film configured to set a threshold of a gate electrode included in the transistor, the film being a metal film comprised of at least one metal selected from the group consisting of Ni, Pd, Pt, Co, Rh, Ru. Cu, Ag, and Au, a film comprised of a nitride, silicide, carbide, or oxide of at least one metal selected from the metal group, a film comprised of a nitride of Ti, Ta, Zr, Hf, or Nb having a stoichiometric composition of TiN, TaN, ZrN, HfN, or NbN, a film comprised of Ru oxide, or a film comprised of Ir oxide.

15. The semiconductor device of claim 1, wherein the first conductive film has a disconnection in a gate electrode included in the transistor in a plane perpendicular to a main surface of the semiconductor substrate.

16. The semiconductor device of claim 1, wherein the second conductive film is formed of a metal film.

17. The semiconductor device of claim 16, wherein the second conductive film is a metal film comprised of at least one metal selected from the group consisting of Ti, Zr, Hf, V, Nb, Ta, Cr, Mo, and W, or a film comprised of a nitride, silicide, or carbide of at least one metal selected from the metal group, where the nitride of Ti, Ta, Zr, Hf, or Nb does not have a stoichiometric composition and contains a smaller amount of N.

18. The semiconductor device of claim 16, wherein the second conductive film is a film configured to set a threshold of a gate electrode included in the transistor, the film being a metal film comprised of at least one metal selected from the group consisting of Ni, Pd, Pt, Co, Rh, Ru, Cu, Ag, and Au, a film comprised of a nitride, silicide, carbide, or oxide of at least one metal selected from the metal group, a film comprised of a nitride of Ti, Ta, Zr, Hf, or Nb having a stoichiometric composition of TiN, TaN, ZrN, HfN, or NbN, a film comprised of Ru oxide, or a film comprised of Ir oxide.

19. The semiconductor device of claim 16, wherein the second conductive film is comprised of the same material for the first conductive film.

20. The semiconductor device of claim 16, wherein
- the second conductive film is formed of a multilayer film including an inner conductive film and an outer conductive film,
- the inner conductive film is a film comprised of Ti, Zr, Hf, V. Nb, Ta, Cr, Mo, W, Ni, Pd, Pt, Co, Rh. Ru, Cu, Ag, or Au, and
- the outer conductive film is an oxidation resistant film comprised of TiN, TaN, Ir oxide, Ru oxide, Pt, or Au.

21. The semiconductor device of claim 1, wherein the second conductive film is formed of a silicide film.

22. The semiconductor device of claim 21, wherein the second conductive film contains at least one selected from the group consisting of Ni, Co, Ti, W, Pt, and Mo.

23. The semiconductor device of claim 21, wherein
- the second conductive film is formed of a multilayer film including an inner conductive film and an outer conductive film,
- the inner conductive film is a film containing at least one selected from the group consisting of Ni, Co, Ti, W, Pt, and Mo, and
- the outer conductive film is an oxidation resistant film comprised of TiN, TaN, Ir oxide, Ru oxide, Pt, or Au.

24. The semiconductor device of claim 3, wherein when the second conductive film is formed of a silicide film and the third conductive film is formed of the silicide material, the second conductive film is comprised of the same material for the third conductive film.

\* \* \* \* \*